US012581209B2

(12) United States Patent
Lee et al.

(10) Patent No.: US 12,581,209 B2
(45) Date of Patent: Mar. 17, 2026

(54) IMAGE SENSOR INCLUDING COLOR SEPARATING LENS ARRAY AND ELECTRONIC DEVICE INCLUDING THE IMAGE SENSOR

(71) Applicant: SAMSUNG ELECTRONICS CO., LTD., Suwon-si (KR)

(72) Inventors: Junho Lee, Suwon-si (KR); Sookyoung Roh, Suwon-si (KR); Sangyun Lee, Suwon-si (KR); Hyunsung Park, Suwon-si (KR); Seokho Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

(21) Appl. No.: 18/415,243

(22) Filed: Jan. 17, 2024

(65) Prior Publication Data

US 2024/0244340 A1     Jul. 18, 2024

(30) Foreign Application Priority Data

Jan. 17, 2023     (KR) ........................ 10-2023-0006982
Mar. 28, 2023     (KR) ........................ 10-2023-0040757

(51) Int. Cl.
H04N 25/13      (2023.01)
G02B 5/20       (2006.01)
(Continued)

(52) U.S. Cl.
CPC ........... H04N 25/134 (2023.01); G02B 5/201 (2013.01); G02B 27/102 (2013.01);
(Continued)

(58) Field of Classification Search
CPC .... H04N 25/134; G02B 5/201; G02B 27/102; G02B 27/123; H10F 39/182; H10F 39/8063; H10F 39/8053
See application file for complete search history.

(56) References Cited

U.S. PATENT DOCUMENTS 7,202,896 B2     4/2007   Wako et al.
8,076,745 B2     12/2011  Nishiwaki
(Continued)

FOREIGN PATENT DOCUMENTS

JP          2022-051762 A      4/2022
KR     10-2016-0139266 A      12/2016
(Continued)

OTHER PUBLICATIONS

Communication issued on May 5, 2024 by the Korean Intellectual Property Office for Korean Patent Application No. 10-2023-0040757.
(Continued)

*Primary Examiner* — Hung H Lam
(74) *Attorney, Agent, or Firm* — Sughrue Mion, PLLC

(57)                ABSTRACT

An image sensor includes a sensor substrate including a plurality of unit pixels; a plurality of unit color filters on the sensor substrate, each unit color filter of the plurality of unit color filters including a plurality of nanoposts; a color separating lens array on the plurality of unit color filters, the color separating lens array being configured to separate and condense incident light based on a wavelength of the incident light; and a spacer layer between the sensor substrate and the color separating lens array, wherein at least one of a diameter and a height of the plurality of nanoposts provided in each unit color filter of the plurality of unit color
(Continued)

filters in regions are different from each other based on values of a chief ray angle (CRA) corresponding to the regions.

20 Claims, 22 Drawing Sheets

(51) Int. Cl.
| | |
|---|---|
| *G02B 27/10* | (2006.01) |
| *G02B 27/12* | (2006.01) |
| *H10F 39/00* | (2025.01) |
| *H10F 39/18* | (2025.01) |

(52) U.S. Cl.
CPC ......... *G02B 27/123* (2013.01); *H10F 39/182* (2025.01); *H10F 39/8063* (2025.01)

(56) References Cited

U.S. PATENT DOCUMENTS

| | | | |
|---|---|---|---|
| 9,691,800 B2 | 6/2017 | Yang | |
| 9,860,491 B2 | 1/2018 | Park et al. | |
| 2017/0170220 A1* | 6/2017 | Nam | H10F 39/8053 |
| 2018/0292585 A1 | 10/2018 | Yun et al. | |
| 2019/0196183 A1 | 6/2019 | Yokogawa | |
| 2021/0124179 A1* | 4/2021 | Yun | H10F 39/8063 |
| 2021/0125301 A1* | 4/2021 | Park | G06T 1/0007 |
| 2021/0126029 A1* | 4/2021 | Roh | H10F 39/156 |
| 2021/0126030 A1 | 4/2021 | Yun et al. | |
| 2021/0126035 A1 | 4/2021 | Roh et al. | |
| 2021/0249459 A1* | 8/2021 | Yun | H10F 39/8053 |
| 2022/0034481 A1* | 2/2022 | Caprara | F21V 11/06 |
| 2022/0137424 A1 | 5/2022 | Lee et al. | |
| 2022/0208822 A1 | 6/2022 | Yun et al. | |
| 2023/0039902 A1 | 2/2023 | Nam et al. | |
| 2023/0352506 A1 | 11/2023 | Ahn et al. | |
| 2025/0204229 A1* | 6/2025 | Bai | H10K 59/1201 |

FOREIGN PATENT DOCUMENTS

| | | | |
|---|---|---|---|
| KR | 10-2017-0070685 A | 6/2017 |
| KR | 10-2017-0105877 A | 9/2017 |
| KR | 10-2395992 B1 | 5/2022 |
| KR | 10-2022-0096967 A | 7/2022 |

OTHER PUBLICATIONS

Panda, Soumyashree Soumyaprakash et al., "All-Dielectric Metasurfaces for Reflection and Transmission-Mode Color Filter Arrays", 2019 Workshop on Recent Advances in Photonics (WRAP), Dec. 13, 2019, No. 19413755. (3 pages total).

Park, Chul-Soon et al., "Structural Color Filters Enabled by a Dielectric Metasurface Incorporating Hydrogenated Amorphous Silicon Nanodisks", Scientific Reports, vol. 7, No. 2556, May 31, 2017. (9 pages total).

Koirala, Ishwor et al., "Highly transmissive subtractive color filters based on an all-dielectric metasurface incorporating TiO2 nanopillars", Optics Express, vol. 26, No. 14, Jul. 9, 2018, pp. 18320-18330. (11 pages total).

Shaukat, Ayesha et al., "Nanostructured Color Filters: A Review of Recent Developments", Nanomaterials, Aug. 7, 2020, vol. 10, No. 1554, pp. 1-36. (36 pages total).

Communication issued Jan. 10, 2025 by the Korean Intellectual Property Office in Korean Patent Application No. 10-2023-0040757.

* cited by examiner

IMAGE SENSOR INCLUDING COLOR SEPARATING LENS ARRAY AND ELECTRONIC DEVICE INCLUDING THE IMAGE SENSOR

CROSS-REFERENCE TO RELATED APPLICATION

This application is based on and claims priority under 35 U.S.C. § 119 to Korean Patent Application Nos. 10-2023-0006982, filed on Jan. 17, 2023, and 10-2023-0040757, filed on Mar. 28, 2023, in the Korean Intellectual Property Office, the disclosures of which are incorporated by reference herein in their entireties.

BACKGROUND

1. Field

Example embodiments of the present disclosure relate to an image sensor and an electronic device including the image sensor, and more particularly, to an image sensor having a color separating lens array and an electronic device including the image sensor.

2. Description of Related Art

The number of pixels included in image sensors has been gradually increased, and accordingly, pixel miniaturization is required. Securing the amount of light and removing noise are important issues for pixel miniaturization.

Image sensors typically display images of various colors or detect the color of incident light using a color filter. However, since the color filter absorbs light of the remaining colors except for light of the corresponding color, light utilization efficiency of color filter may be reduced. For example, in the case of using a red-green-blue (RGB) color filter, only one-third of the incident light is transmitted and the remaining two-thirds are absorbed, so the light utilization efficiency of the color filter is only about 33%, and thus, light loss is very high.

Therefore, in recent years, various attempts have been made to improve the light utilization efficiency of the image sensors.

SUMMARY

Example embodiments provide an image sensor with improved light utilization efficiency and an electronic device including the image sensor, wherein the image sensor includes a color separating lens array and a color filter including a nanopost.

Additional aspects will be set forth in part in the description which follows and, in part, will be apparent from the description, or may be learned by practice of the presented embodiments of the disclosure.

According to an aspect of an example embodiment, there is provided an image sensor including a sensor substrate including a plurality of unit pixels, a plurality of unit color filters on the sensor substrate, each unit color filter among the plurality of unit color filters including a plurality of nanoposts, a color separating lens array on the plurality of unit color filters, the color separating lens array being configured to separate and condense incident light based on wavelength, and a spacer layer between the sensor substrate and the color separating lens array, wherein at least one of a diameter and a height of the plurality of nanoposts provided in each unit color filter among the plurality of unit color filters in regions are different from each other based on values of a chief ray angle (CRA) corresponding to the regions.

The plurality of unit color filters may include a first unit color filter in an area where a value of the CRA is a first value and a second unit color filter in an area where a value of the CRA is a second value that is greater than the first value, and diameters of the plurality of nanoposts in the second unit color filter may be less than diameters of the plurality of nanoposts in the first unit color filter.

The plurality of unit color filters may include a green color filter, a red color filter, and a blue color filter, and a reduction of diameters of the plurality of nanoposts in the red color filter may be greater than a reduction of diameters of the plurality of nanoposts in the green color filter and the blue color filter.

The plurality of unit color filters may include a first unit color filter in an area where a value of the CRA is a first value and a second unit color filter in an area where a value of the CRA is a second value that is different from the first value, and heights of the plurality of nanoposts in the second unit color filter may be different from heights of the plurality of nanoposts in the first unit color filter.

The plurality of unit color filters may include a green color filter, a red color filter, and a blue color filter, the plurality of unit color filters may include a first unit color filter in an area where a value of the CRA is a first value and a second unit color filter in an area where a value of the CRA is a second value that is greater than the first value, heights of the plurality of nanoposts in the blue color filter of the second unit color filter may be greater than heights of the plurality of nanoposts in the blue color filter of the first unit color filter, heights of the plurality of nanoposts in the red color filter of the second unit color filter may be less than heights of the plurality of nanoposts in the red color filter of the first unit color filter, and heights of the plurality of nanoposts in the green color filter of the second unit color filter may be less than heights of the plurality of nanoposts in the green color filter of the first unit color filter.

The plurality of unit color filters may include a green color filter, a red color filter, and a blue color filter, and amounts of change in the diameter and the height of the plurality of nanoposts in each unit color filter among the plurality of unit color filters based on a value of the CRA may be different from each other in the green color filter, the red color filter, and the blue color filter.

The plurality of unit color filters may include a first unit color filter in an area where a value of the CRA is a first value and a second unit color filter in an area where a value of the CRA is a second value that is greater than the first value, and diameters of the plurality of nanoposts in the second unit color filter may be less than diameters of the plurality of nanoposts in the first unit color filter, and heights of the plurality of nanoposts in the second unit color filter may be different from heights of the plurality of nanoposts in the first unit color filter.

In each unit color filter among the plurality of unit color filters, the plurality of nanoposts may be in an N×N pattern, where N is a natural number greater than or equal to 2.

In each unit color filter among the plurality of unit color filters, the plurality of nanoposts may be in a square pattern or a hexagonal pattern.

Diameters of the plurality of nanoposts in a green color filter among the plurality of unit color filters may be different from each other.

According to another aspect of an example embodiment, there is provided an electronic device including a lens assembly including one or more lenses, the lens assembly being configured to form an optical image of a subject, an image sensor configured to convert the optical image formed by the lens assembly into an electrical signal, and a processor configured to process the electrical signal generated by the image sensor, wherein the image sensor includes a sensor substrate including a plurality of unit pixels, a plurality of unit color filters on the sensor substrate, each unit color filter among the plurality of unit color filters including a plurality of nanoposts, a color separating lens array on the plurality of unit color filters, the color separating lens array being configured to separate and condense incident light based on wavelength, and a spacer layer between the sensor substrate and the color separating lens array, and wherein at least one of a diameter and a height of the plurality of nanoposts provided in each unit color filter among the plurality of unit color filters in regions are different from each other based on values of chief ray angle (CRA) corresponding to the regions.

The plurality of unit color filters may include a first unit color filter in an area where a value of the CRA is a first value and a second unit color filter in an area where a value of the CRA is a second value that is greater than the first value, and diameters of the plurality of nanoposts in the second unit color filter may be less than diameters of the plurality of nanoposts provided in the first unit color filter.

The plurality of unit color filters may include a green color filter, a red color filter, and a blue color filter, and a reduction of diameters of the plurality of nanoposts in the blue color filter may be greater than a reduction of diameters the plurality of nanoposts in the green color filter and the red color filter.

The plurality of unit color filters may include a first unit color filter in an area where a value of the CRA is a first value and a second unit color filter in an area where a value of the CRA is a second value that is different from the first value, and heights of the plurality of nanoposts in the second unit color filter may be different from heights of the plurality of nanoposts in the first unit color filter.

The plurality of unit color filters may include a green color filter, a red color filter, and a blue color filter, and the plurality of unit color filters may include a first unit color filter in an area where a value of the CRA is a first value and a second unit color filter in an area where a value of the CRA is a second value that is greater than the first value, heights of the plurality of nanoposts in the blue color filter of the second unit color filter may be greater than heights of the plurality of nanoposts in the blue color filter of the first unit color filter, heights of the plurality of nanoposts in the red color filter of the second unit color filter may be less than heights of the plurality of nanoposts in the red color filter of the first unit color filter, and heights of the plurality of nanoposts in the green color filter of the second unit color filter may be less than heights of the plurality of nanoposts in the green color filter of the first unit color filter.

The plurality of unit color filters may include a green color filter, a red color filter, and a blue color filter, and amounts of change in the diameter and the height of the plurality of nanoposts in each unit color filter among the plurality of unit color filters based on a value of the CRA may be different from each other in the green color filter, the red color filter, and the blue color filter.

The plurality of unit color filters may include a first unit color filter in an area where a value of the CRA is a first value and a second unit color filter in an area where a value of the CRA is a second value, the second value being greater than the first value, and diameters of the plurality of nanoposts in the second unit color filter may be less than diameters of the plurality of nanoposts in the first unit color filter, and heights of the plurality of nanoposts in the second unit color filter may be different from heights of the plurality of nanoposts in the first unit color filter.

According to yet another aspect of an example embodiment, there is provided an image sensor including a sensor substrate including a plurality of unit pixels, a plurality of unit color filters on the sensor substrate, each unit color filter among the plurality of unit color filters including a plurality of nanoposts, a color separating lens array on the plurality of unit color filters, the color separating lens array being configured to separate and condense incident light based on wavelength, and a spacer layer between the sensor substrate and the color separating lens array, wherein at least one of diameters and heights of the plurality of nanoposts in each unit color filter among the plurality of unit color filters in a region are different from each other based on a value of a chief ray angle (CRA) corresponding to the region, and wherein at least one of the diameters and the heights of the plurality of nanoposts in at least one unit color filter among the plurality of unit color filters are different from each other.

The plurality of unit color filters may include a first unit color filter in an area where a value of the CRA is a first value and a second unit color filter in an area where a value of the CRA is a second value that is greater than the first value, and diameters of the plurality of nanoposts in the second unit color filter may be less than diameters of the plurality of nanoposts in the first unit color filter.

The plurality of unit color filters may include a green color filter, a red color filter, and a blue color filter, and a reduction of diameters of the plurality of nanopost in the red color filter may be greater than a reduction of diameters of the plurality of nanoposts in the green color filter and the blue color filter.

BRIEF DESCRIPTION OF THE DRAWINGS

The above and other aspects, features, and advantages of certain example embodiments of the disclosure will be more apparent from the following description taken in conjunction with the accompanying drawings, in which:

FIG. 2 is a diagram illustrating a pixel array of an image sensor including a color separating lens array, according to an example embodiment;

FIG. 13 is a diagram illustrating a color filter array of an image sensor, according to an example embodiment;

DETAILED DESCRIPTION

Figure 1:
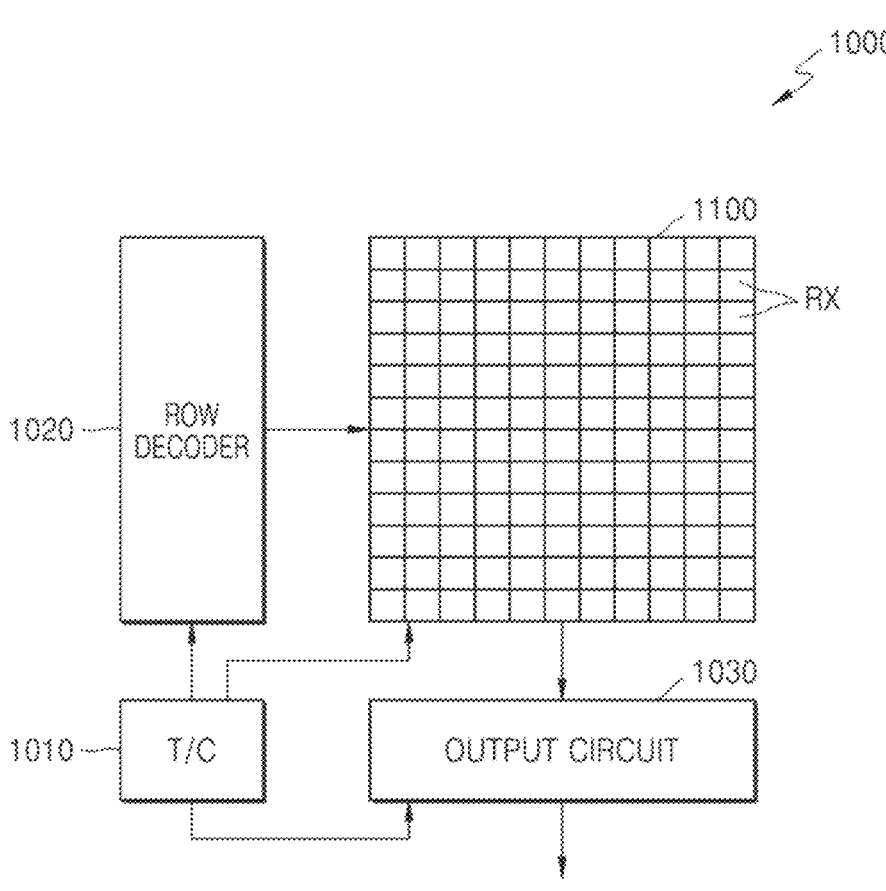
FIG. 1 is a block diagram of an image sensor according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, an image sensor including a color separating lens array and an electronic device including the image sensor will be described in detail with reference to the accompanying drawings. Embodiments described below are merely illustrative, and various modifications are possible from these example embodiments. In the following drawings, the same reference numerals refer to the same components, and the size of each component in the drawings may be exaggerated for clarity and convenience of description.

Hereinafter, the term "upper portion" or "on" may also include "to be present on the top, bottom, left or right portion on a non-contact basis" as well as "to be present just on the top, bottom, left or right portion on a directly contact basis".

The terms first, second, etc. may be used to describe various components, but are used only for the purpose of distinguishing one component from another component. These terms do not limit the difference in material or structure of components.

Singular expressions include plural expressions unless they are explicitly meant differently in context. In addition, when a part "includes" a component, this means that it may include more other components, rather than excluding other components, unless otherwise stated.

Further, the terms "unit", "module" or the like mean a unit that processes at least one function or operation, which may be implemented in hardware or software or implemented in a combination of hardware and software.

The use of the term "the" and similar indicative terms may correspond to both singular and plural.

Steps constituting the method may be performed in an appropriate order unless there is a clear statement that the steps should be performed in the order described. In addition, the use of all illustrative terms (e.g., etc.) is simply intended to detail technical ideas and, unless limited by the claims, the scope of rights is not limited due to the terms.

An attempt is made using a color separating lens array. The color separating lens array may separate the color of the incident light using diffraction or refraction characteristics of different light depending on the wavelength, and adjust the directionality for each wavelength according to the refractive index and shape. Colors separated by the color separating lens array may be transferred to each corresponding pixel.

FIG. 1 is a schematic block diagram of an image sensor according to an example embodiment.

Referring to FIG. 1, the image sensor 1000 may include a pixel array 1100, a timing controller 1010, a row decoder 1020, and an output circuit 1030. The image sensor may include a charge coupled device (CCD) image sensor or a complementary metal oxide semiconductor (CMOS) image sensor.

The pixel array 1100 includes pixels arranged in two dimensions along a plurality of rows and columns. The row decoder 1020 selects one of rows of the pixel array 1100 in response to a row address signal output from the timing controller 1010. The output circuit 1030 outputs a light detection signal in units of columns from a plurality of pixels arranged along the selected row. To this end, the output circuit 1030 may include a column decoder and an analog-to-digital converter (ADC). For example, the output circuit 1030 may include a plurality of analog-to-digital converters (ADCs) provided for each column between a column decoder and the pixel array 1100, or one ADC provided at the output end of the column decoder. The timing controller 1010, the row decoder 1020, and the output circuit 1030 may be implemented as one chip or each separate chip. A processor for processing an image signal output through the output circuit 1030 may be implemented as one chip together with the timing controller 1010, the row decoder 1020, and the output circuit 1030.

Figure 2:
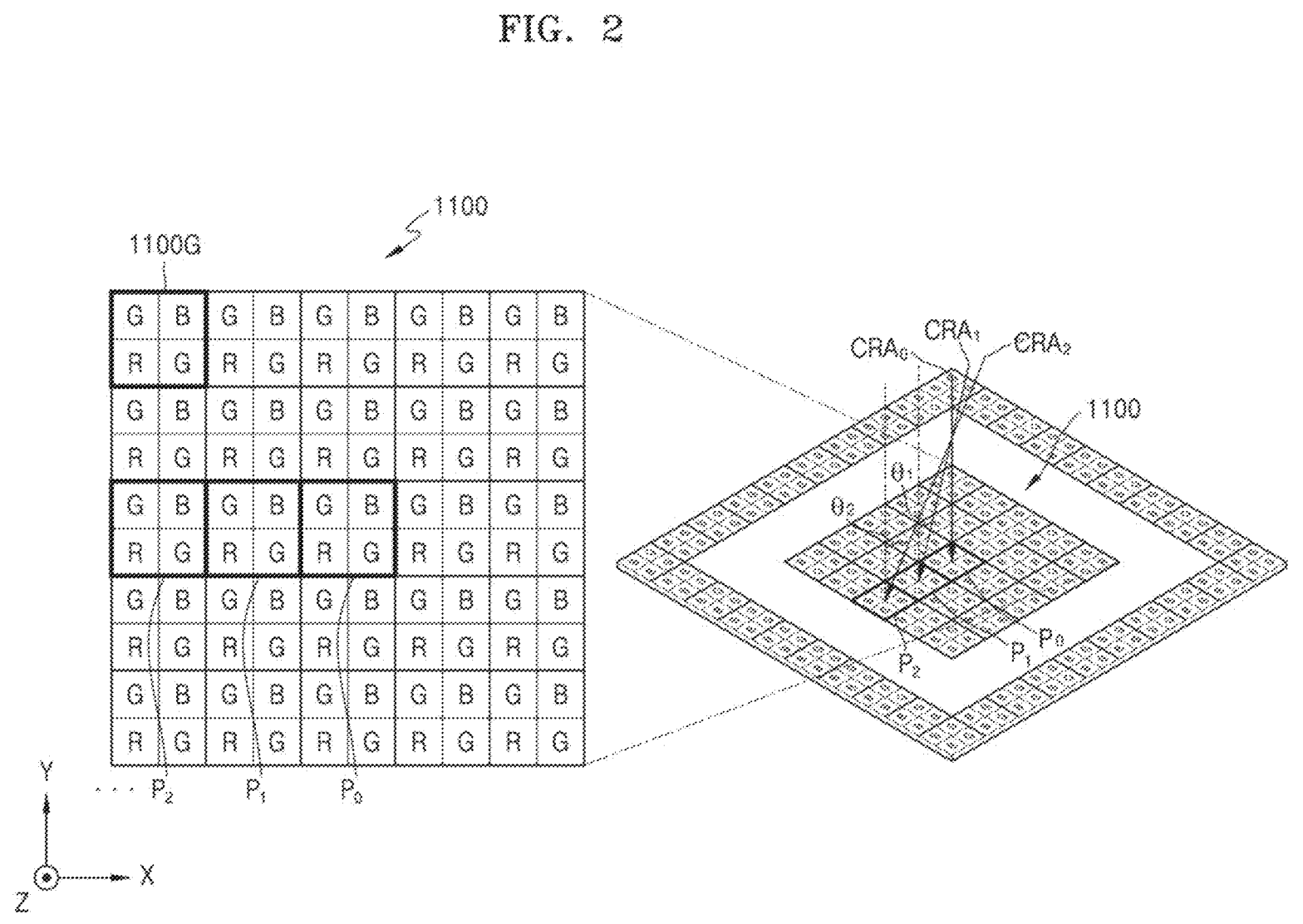

FIG. 2 is a diagram illustrating an embodiment of a pixel array.

Referring to FIG. 2, the pixel array 1100 may include a plurality of unit pixel arrays 1100G. One unit pixel array may include four quadrant regions, and each of the first to fourth quadrants may be provided with one blue (B) pixel, one red (G) pixel, and two green (R) pixels. These unit patterns may be two-dimensionally repeatedly arranged in the first direction (X direction) and the second direction (Y direction). For example, one red (G) pixel, one blue (B) pixel, and two green (G) pixels may be arranged in the unit pixel array 1100G in the form of a 2×2 array. In the overall pixel arrangement, a first row in which a plurality of green (G) pixels and a plurality of blue (B) pixels are alternately arranged in a first direction (X direction) and a second row in which a plurality of red (R pixels) pixels and a plurality of green (G pixels) pixels are alternately arranged in a first direction (X direction) may be repeatedly in a second direction (Y direction). The arrangement method of the pixel array 1100 is possible in various ways in addition to the arrangement of FIG. 2, and the pixels of the pixel array 1100 may be arranged in various ways according to the color characteristics of the image sensor 1000. Although the pixel array 1100 of the image sensor 1000 is described below as having the arrangement of FIG. 2, the operating principle may be applied to other types of pixel arrangements.

A chief ray angle (CRA), which is the angle of the incident light incident to the center of the module lens, may be different for each unit pixel array 1100G. As the distance from the center of the pixel array 1100 increases, a CRA value of the unit pixel array 1100G increases. For example, referring to FIG. 2, when the incident angle of the incident light incident on the central unit pixel array ($P_0$) of the pixel array 1100 may be $CRA_0$, the incident angle of the incident light incident on $P_1$ may be $CRA_1$, and the incident angle of the incident light incident on $P_2$ may be $CRA_2$, an inequation $CRA_0(=0°)<CRA_1<CRA_2$ may be satisfied. Although $P_0$ with a value of $CRA_0$, $P_1$ with a value of $CRA_1$, and $P_2$ with a value of $CRA_2$ are sequentially arranged in FIG. 2, a value of CRA may be maintained during a certain unit pixel array section. For example, at least one unit pixel array 1100G with a value of $CRA_0$ may be arranged between $P_0$ and $P_1$ described above, and at least one unit pixel array 1100G with a value of $CRA_1$ may be arranged between $P_1$ and $P_2$.

The pixel array 1100 of the image sensor 1000 may include a color separating lens array (CSLA) that concentrates light of a color corresponding to a specific pixel. The spectrum of the light passing through the color separating lens array may have a red-shift tendency as the CRA value increases.

Figure 3:
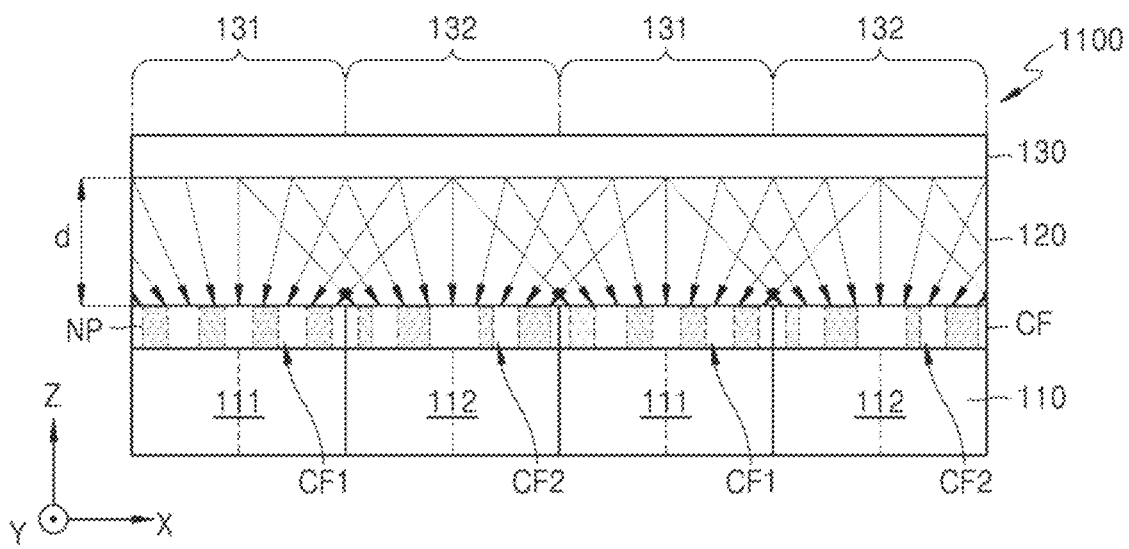
FIGS. 3 and 4 are cross-sectional views illustrating a first-direction cross-section of the image sensor of FIG. 2, according to an example embodiment.
Figure 4:
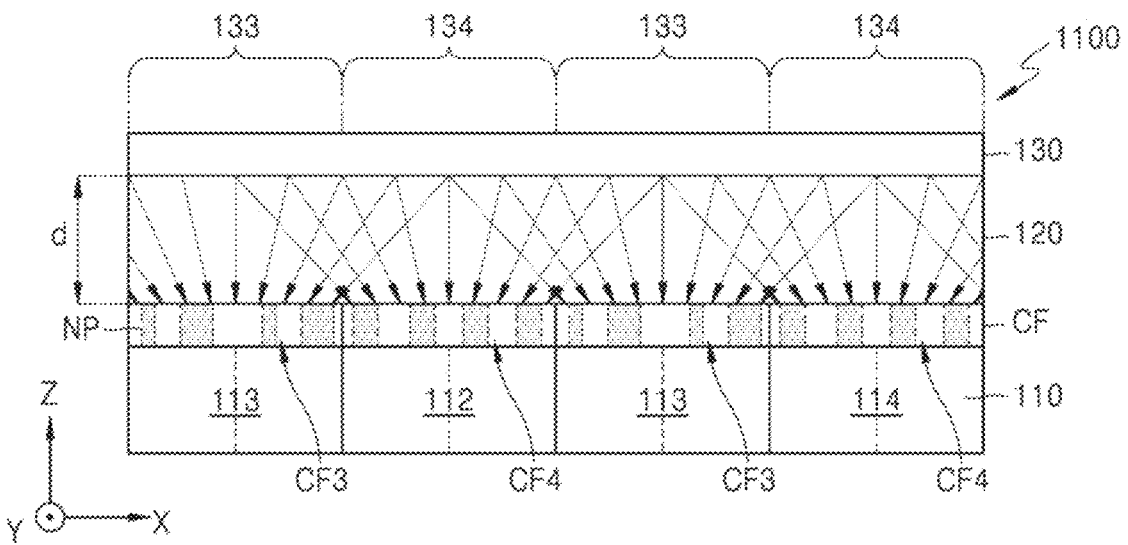

FIGS. 3 and 4 are cross-sectional views illustrating an example embodiment of a first-direction cross-section of the image sensor of FIG. 2.

Referring to FIGS. 3 and 4, the unit pixel array of the image sensor may include a sensor substrate 110 including a plurality of pixels 111, 112, 113, and 114 for sensing light, color filters CF1, CF2, CF3, and CF4 provided on the sensor substrate 110, and a color separating lens array 130 provided above the color filters CF1, CF2, CF3, and CF4. A spacer layer 120 may be provided between the color filters CF1, CF2, CF3, and CF4 and the color separating lens array 130. Although FIGS. 3 and 4 illustrates that the spacer layer 120 provided between the color filters CF1, CF2, CF3, and CF4 and the color separating lens array 130, the spacer layer 120 may be also provided between the sensor substrate 110 and the color filters CF1, CF2, CF3, and CF4.

The sensor substrate 110 may include a plurality of pixels 111, 112, 113, and 114 that convert light into an electrical signal. Through this region classification, incident light is divided and sensed into unit patterns (e.g., a Bayer pattern). For example, the first pixel 111 and the fourth pixel 114 of the unit pixel array may sense light of a first wavelength (e.g., green (G) light), the second pixel 112 may sense light of a second wavelength (e.g., blue (B) light), and the third pixel 113 may sense light of a third wavelength (e.g., red (R) light). The plurality of pixels 111, 112, 113, and 114 may be two-dimensionally arranged in a first direction (X direction) and a second direction (Y direction). For example, the first pixel 111, the second pixel 112, the third pixel 113, and the fourth pixel 114 may be provided in a 2×2 arrangement. The 2×2 arrangement of the first pixel 111, the second pixel 112, the third pixel 113, and the fourth pixel 114 may be repeatedly provided on the sensor substrate 110.

The spacer layer 120 may be provided between the sensor substrate 110 and the color separating lens array 130, and the distance between the sensor substrate 110 and the color separating lens array 130 may be kept constant. The spacer layer 120 may be made of a material having a lower refractive index than a refractive index of a nanopost, such as a polymer, an oxide-based material, silicon oxide ($SiO_2$), and siloxane-based Spin On Glass.

The color separating lens array 130 may be provided on the spacer layer 120, and the color separating lens array 130 may be divided in various ways. For example, the color separating lens array 130 may be divided into a first pixel corresponding region 131 corresponding to the first pixel 111 in which light of the first wavelength included in the incident light (Li) is concentrated, a second pixel corresponding region 132 corresponding to the second pixel 112 in which light of the second wavelength included in the incident light (Li) is concentrated, a third pixel corresponding region 133 corresponding to the third pixel 113 in which light of the third wavelength included in the incident light (Li) is concentrated, and a fourth pixel corresponding region 134 corresponding to the fourth pixel 114 in which light of a first wavelength included in the incident light (Li) is concentrated. The pixel corresponding regions 131, 132, 133, and 134 may be two-dimensionally arranged in the first direction (X direction) and the second direction (Y direction). The pixel corresponding regions 131, 132, 133, and 134 of the color separating lens array 130 may be provided to face the pixels 111, 112, 113, and 114 in the sensor substrate 110, respectively. For example, the first pixel corresponding region 131 may correspond to the first pixel 111 and be provided above the first pixel 111, the second pixel corresponding region 132 may correspond to the second pixel 112 and be provided above the second pixel 112, the third pixel corresponding region 133 may correspond to the third pixel 113 and be provided above the third pixel 113, and the fourth pixel corresponding region 134 may correspond to the fourth pixel 114 and be provided above the fourth pixel 114.

The color separating lens array 130 may be configured to form different phase profiles for light of the first wavelength, the second wavelength, and the third wavelength included in the incident light (Li) to perform color separating between pixels. Since the refractive index of the material varies depending on the wavelength of the responding light, the color separating lens array 130 may provide different phase profiles for light of the first to third wavelengths. For example, since even the same material has the refractive index which varies depending on the wavelength of light reacting to the material, and has the phase delay that light experiences when passing through the material, which varies from wavelength to wavelength, different phase profiles may be formed for wavelengths, respectively. For example, a refractive index with respect to light of the first wavelength of the first pixel corresponding region 131 and a refractive index of light of the second wavelength of the first pixel corresponding region 131 may be different from each other, and a phase delay experienced by light of the first wavelength passing through the first pixel corresponding region 131 and a phase delay experienced by light of the second wavelength passing through the first pixel corresponding region 131 may be different from each other. Thus, when the color separating lens array 130 is designed in consideration of these light characteristics, different phase profiles may be provided for light of the first to third wavelengths. For example, each of the pixel corresponding regions 131, 132, 133, and 134 may be composed of a plurality of nanoposts to have different phase profiles depending on different wavelengths. Such phase profiles may be formed by adjusting the arrangement of the plurality of nanoposts, a period between nanoposts, widths and heights of the nanoposts, and the like.

The color separating lens array 130 may be configured to concentrate light of the first wavelength on the first pixel 111, light of the second wavelength on the second pixel 112, light of the third wavelength on the third pixel 113, and light of the first wavelength on the fourth pixel 114.

As the CRA of the incident light incident on the outer portion of the image sensor increases, the spectrum of the light passing through the color separating lens array 130 may have a red-shift tendency.

The plurality of color filters CF1, CF2, CF3, and CF4 may be provided between the sensor substrate 110 and the spacer layer 120. The plurality of color filters CF1, CF2, CF3, and CF4 may be provided in correspondence to the arrangement of pixels 111, 112, 113, and 114 of the sensor substrate 110, respectively. The first color filter CF1, the second color filter CF2, the third color filter CF3, and the fourth color filter CF4 may be provided to face the respective pixels 111, 112, 113, and 114 of the sensor substrate 110. For example, the first color filter CF1 may correspond to the first pixel 111 and be provided on the first pixel 111, the second color filter CF2 may correspond to the second pixel 112 and be provided on the second pixel 112, the third color filter CF3 may correspond to the third pixel 113 and be provided on the third pixel 113, and the fourth color filter CF4 may correspond to the fourth pixel 114 and be provided on the fourth pixel 114. The first to fourth color filters CF1, CF2, CF3, and CF4 may be two-dimensionally arranged in a 2×2 arrangement in the first direction (X direction) and the second direction (Y direction). The first to fourth color filters CF1, CF2, CF3, and CF4 may form unit color filters provided in the vertical direction corresponding to the unit pixel array, and the unit color filters may be repeatedly provided on the sensor substrate 110.

The color filters CF1, CF2, CF3, and CF4 may transmit only light in a specific wavelength band. For example, each of the first color filter CF1 and the fourth color filter CF4 may be configured to pass only green (G) light to proceed to the first pixel 111 and the fourth pixel 114 provided therebelow, the second color filter CF2 may pass only blue (B) light to proceed to the second pixel 112 provided therebelow, and the third color filter CF3 may pass only red (R) light to proceed to the third pixel 113 provided therebelow.

The color filters CF1, CF2, CF3, and CF4 may include nanoposts NP configured such that a light-receiving spectrum change of the image sensor according to the oblique light is minimized. Each of the color filters CF1, CF2, CF3, and CF4 may include a plurality of nanoposts NP. The plurality of nanoposts provided in the color filters CF1, CF2, CF3, and CF4 may be configured to change a transmission spectrum of light that is color-separated by the color separating lens array according to a light-receiving spectrum for each color pixel. The color filters CF1, CF2, CF3, and CF4 may be provided with a plurality of nanoposts NP arranged based on a specific rule. For example, the rule is applied to parameters such as the shape, size (diameter, height), and interval of the nanoposts (NP), and for example, these parameters may be set to offset the red-shift phenomenon caused by oblique light.

Rules applied to the color filters CF1, CF2, CF3, and CF4 may be respectively different depending on colors transmitted by the color filters. For example, the size, shape, and interval of the nanoposts NP provided in the green color filter, the size, shape, and interval of the nanoposts NP provided in the blue color filter, and the size, shape, and interval of the nanoposts NP provided in the red color filter may be different from one another. In addition, the rule applied to each of the color filters CF1, CF2, CF3, and CF4 may vary depending on the CRA value of each of the color filters.

A diameter of a cross-section of each of the nanoposts NP may have a sub-wavelength dimension that is a wavelength band smaller than a wavelength band of light to be branched. For example, diameters of the nanoposts NP may have dimensions smaller than the first wavelength, the second wavelength, and the third wavelength for each pixel corresponding region. When the incident light (Li) is visible light, the diameter and height of the nanopost (NP) may have dimensions less than, for example, 400 nm, 300 nm, or 200 nm.

The nanoposts NP may be made of a material having a higher refractive index than a refractive index of the surrounding material. For example, the nanoposts NP may include poly-Si. The nanopost NP having a difference in refractive indices from the surrounding material may form a spectrum of light passing through the nanopost NP. This is due to phase delay caused by the shape dimension of the sub-wavelengths of the nanoposts NP, and the degree of phase delay may be determined by the detailed shape dimension and arrangement shape of the nanoposts NP. Although the cross-sectional shape of the nanopost NP is illustrated in the drawings as being circular, the cross-sectional shape of the nanopost NP is not limited thereto, and the nanopost NP may be formed of a pillar having various cross-sectional shapes. In addition, each of the nanoposts NP may have a structure in which a plurality of layers are stacked.

The surrounding material of each of the nanoposts NP may be formed of a dielectric material having a lower refractive index than a refractive index of each of the nanoposts NP. For example, the peripheral material of each of the nanoposts NP may contain at least one of $SiO_2$, air, oxide, and nitride.

Figure 5:
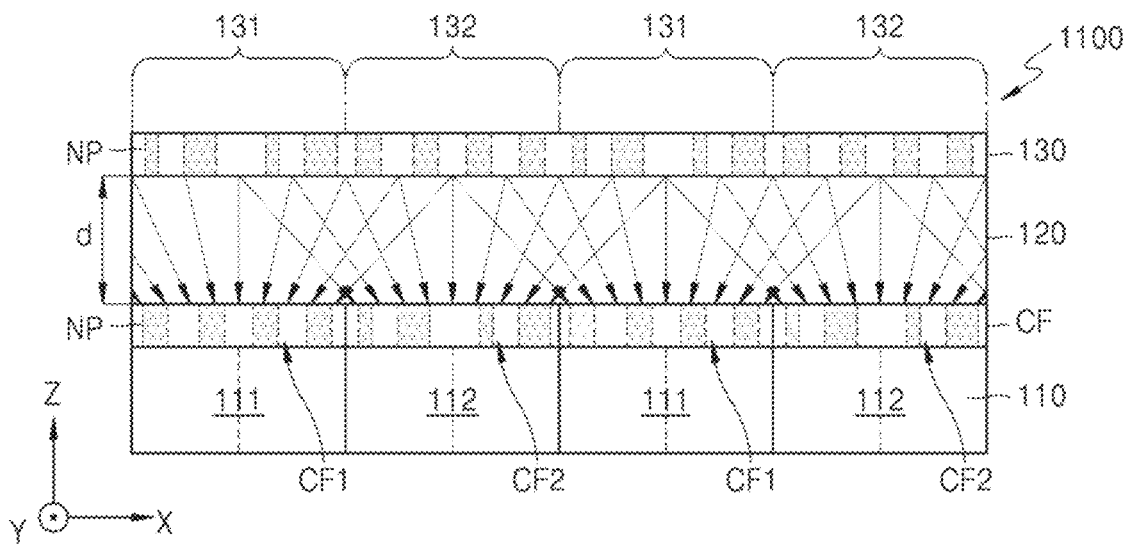
FIGS. 5 and 6 are cross-sectional views illustrating a first-direction cross-section of the image sensor of FIG. 2, according to an example embodiment.
Figure 6:
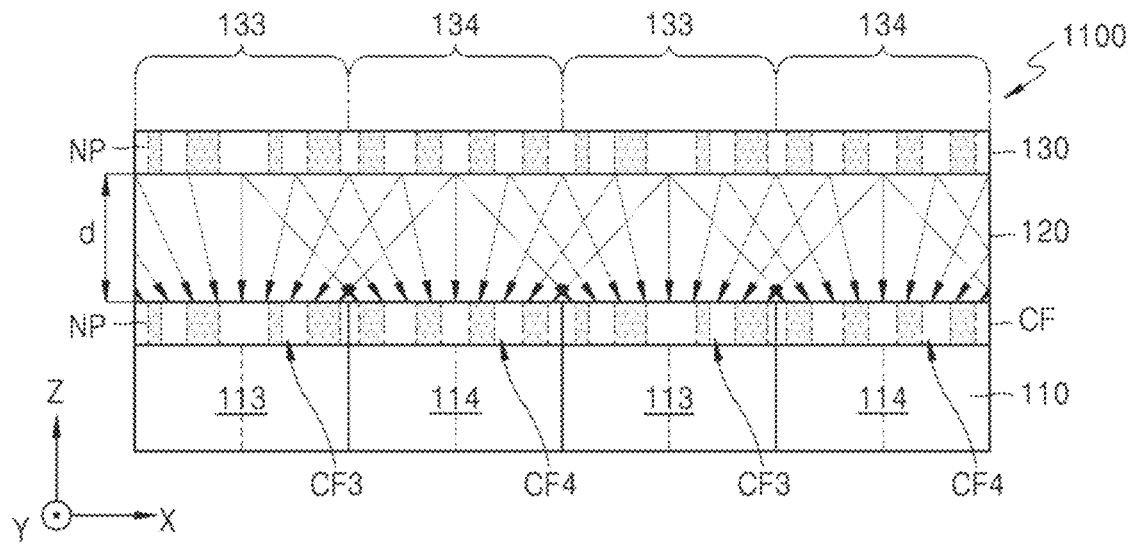

FIGS. 5 and 6 are cross-sectional views illustrating another embodiment of a first-direction cross-section of the image sensor of FIG. 2. Hereinafter, differences between FIGS. 3 and 4 will be mainly described.

Referring to FIGS. 5 and 6, a plurality of nanoposts NP may also be provided in each of the pixel corresponding regions 131, 132, 133, and 134 of the color separating lens array 130, and the nanoposts NP may have different shapes, dimensions, intervals, and/or arrangements depending on regions. The dimension, shape, interval, and/or arrangement of the plurality of nanoposts NP may be configured so that light of the first wavelength is concentrated in the first pixel 111 and the fourth pixel 114 through the color separating lens array 130, light of the second wavelength is concentrated in the second pixel 112, and light of the third wavelength is concentrated in the third pixel 113.

Figure 7:
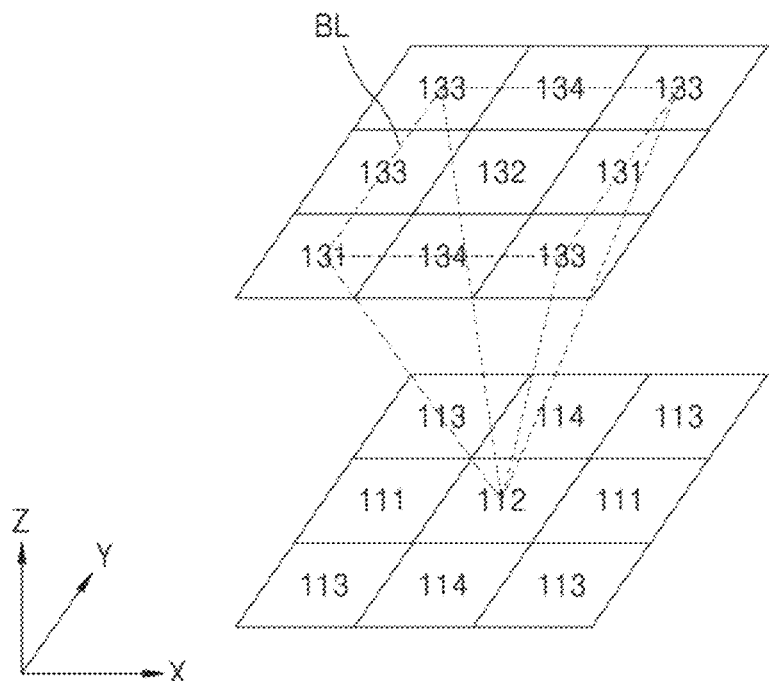
FIGS. 7 and 8 are conceptual diagrams illustrating a structure and an operation of a color separating lens array, according to an example embodiment.
Figure 8:
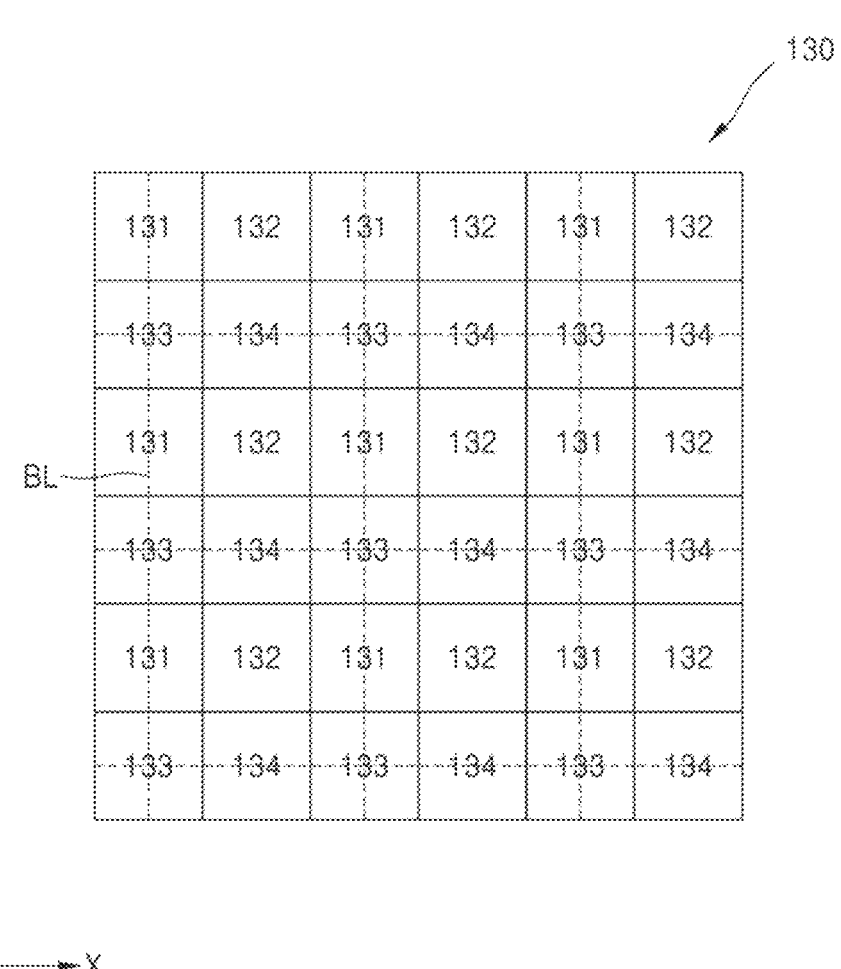

FIGS. 7 and 8 are conceptual diagrams illustrating a structure and an operation of a color separating lens array according to an example embodiment.

In an example embodiment, FIG. 7 shows a blue pixel corresponding region 132 of a color separating lens array 130 corresponding to a blue pixel 112 and a traveling direction of blue light incident around the blue pixel corresponding region 132, and in an example embodiment, FIG. 8 shows blue light concentrating regions BL.

The blue light is condensed to the blue pixel 112 by the color separating lens array 130 as shown in FIG. 7, and blue light from the pixel corresponding regions 131, 132, 133, and 134 is incident on the blue pixel 112. The blue light incident on the blue light concentration regions BL connecting the centers of the four adjacent red pixel corresponding regions 133 facing the four vertices of the blue pixel corresponding region 132 may be concentrated to the blue pixel 112. As shown in FIG. 8, the color separating lens array 130 may operate as a blue light concentration region (BL) array for blue light. The blue light concentration area BL may be larger, for example, 1.5 to 4 times larger than the area of the corresponding blue pixel 112. Although the blue pixel 112 has been described above, the color separating lens array 130 may operate as a green light concentration region array in which green light is concentrated to the green pixels 111 and 114, and may operate as a red light concentration region array in which red light is concentrated to the red pixel 113.

Figure 9A:
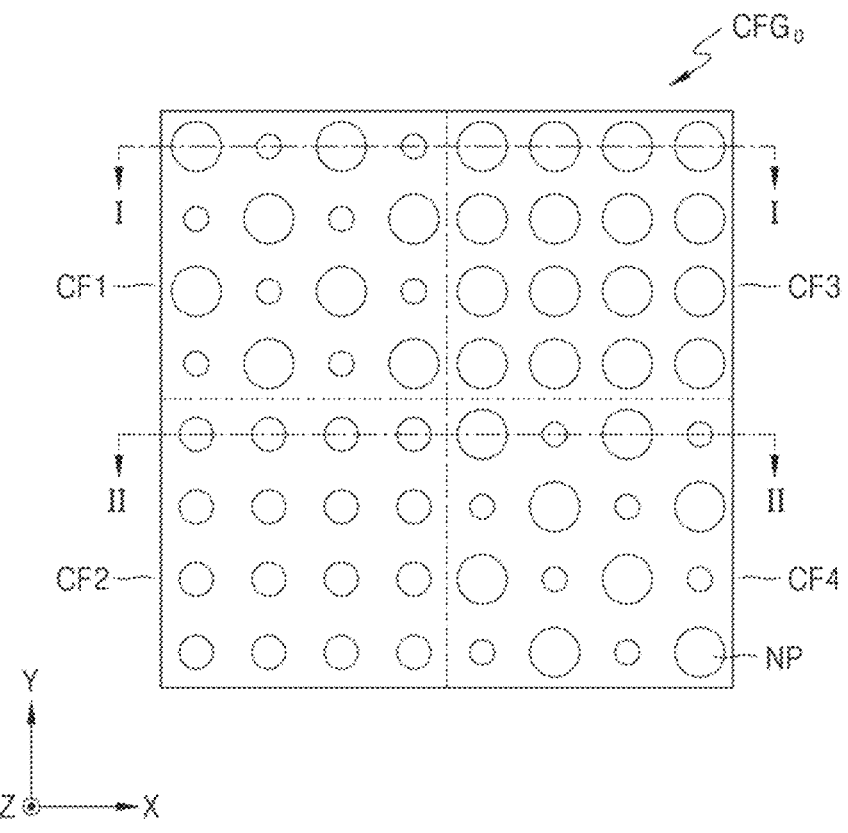
FIGS. 9A, 9B, 10A, 10B, 11A, and 11B are diagrams illustrating a color filter including nanoposts according to a CRA value, according to an example embodiment.
Figure 9B:
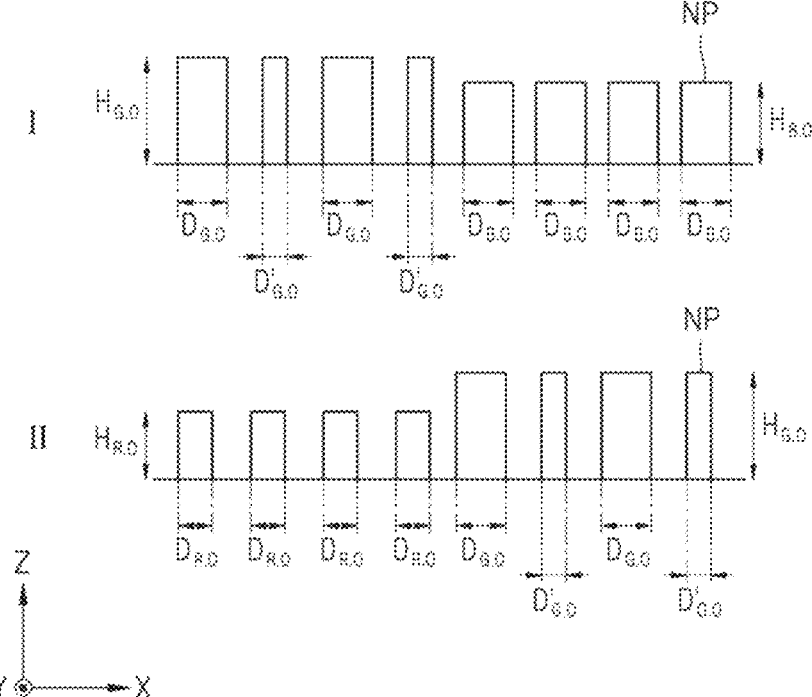

FIGS. 9A to 11B are diagrams illustrating a color filter including nanoposts according to a CRA value, according to an example embodiment;

FIG. 9A is a diagram that shows the rules of the plurality of nanoposts provided in the central unit color filter $CFG_0$ with a value of $CRA_0$, and FIG. 9B is a diagram that shows the I-I cross-section and II-II cross-section of FIG. 9A.

Referring to FIGS. 9A and 9B, the central unit color filter $CFG_0$ with a value of $CRA_0$ may include first to fourth color filters CF1, CF2, CF3, and CF4. The first color filter CF1 and the fourth color filter CF4 may be green color filters designed to transmit green light, the second color filter CF2 may be a blue color filter designed to transmit blue light, and the third color filter CF3 may be a red color filter designed to transmit red light. Each of the color filters CF1, CF2, CF3, and CF4 may include a plurality of nanoposts NP, and the rules applied to the color filters CF1, CF2, CF3, and CF4 may vary depending on the color transmitted by each color filter.

The green color filters CF1 and CF4 included in the central unit color filter $CFG_0$ with a value of $CRA_0$ may include nanoposts NP with a combination of different diameters. For example, the green color filters CF1 and CF4 may include the plurality of nanoposts NP each having a diameter $D_{G,0}$ and a height $H_{G,0}$ respectively, and may include the plurality of nanoposts NP each having a diameter $D_{G,0}'$ and a height $H_{G,0}$ less than $D_{G,0}$. The nanoposts NP with different diameter combinations may be provided in a 4×4 arrangement for each of the green color filters CF1 and CF4, and nanoposts NP each having a diameter $D_{G,0}$ and nanoposts NP each having a diameter $D_{G,0}'$ less that n the diameter $D_{G,0}$ may be alternately provided.

The blue color filter CF2 included in the unit color filter $CFG_0$ with a value of $CRA_0$ may include the plurality of nanoposts NP each having a diameter $D_{B,0}$ and a height $H_{B,0}$, and the plurality of nanoposts NP may be arranged in the second color filter CF2 in a 4×4 arrangement.

The red color filter CF3 included in the central unit color filter $CFG_0$ with a value of $CRA_0$ may include the plurality of nanoposts NP each having a diameter $D_{R,0}$ and a height $H_{R,0}$, and the plurality of nanoposts NP may be arranged in the red color filter CF3 in a 4×4 arrangement.

Figure 10A:
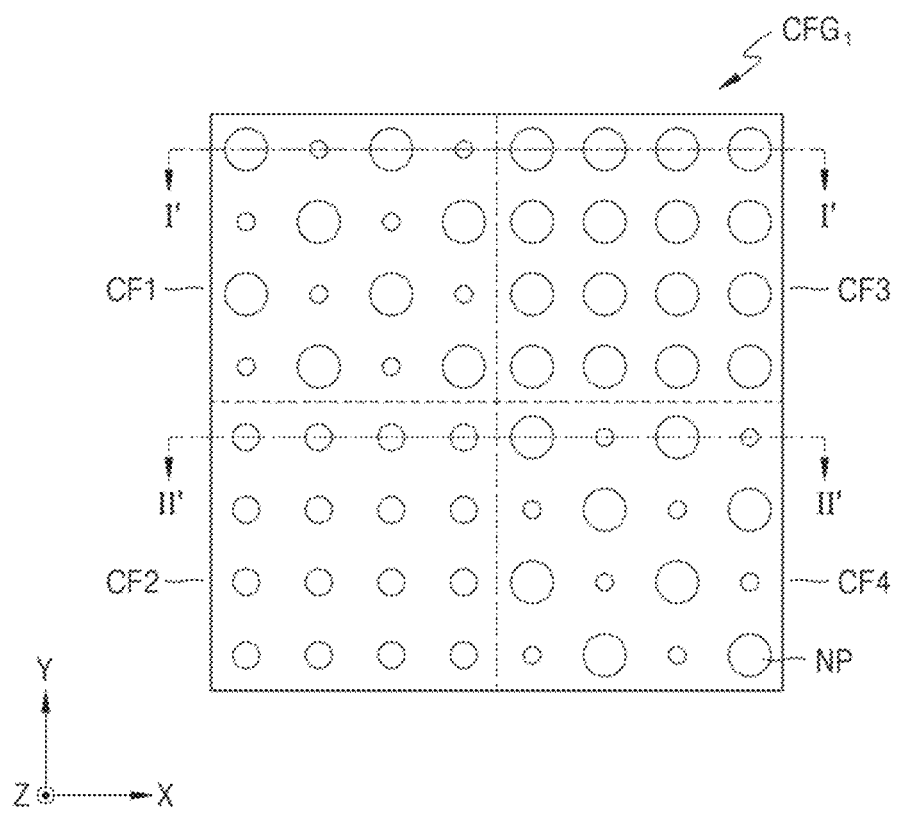
Figure 10B:
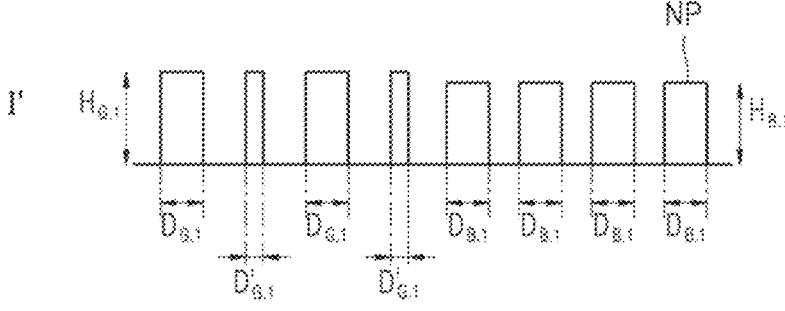
Figure 10B:
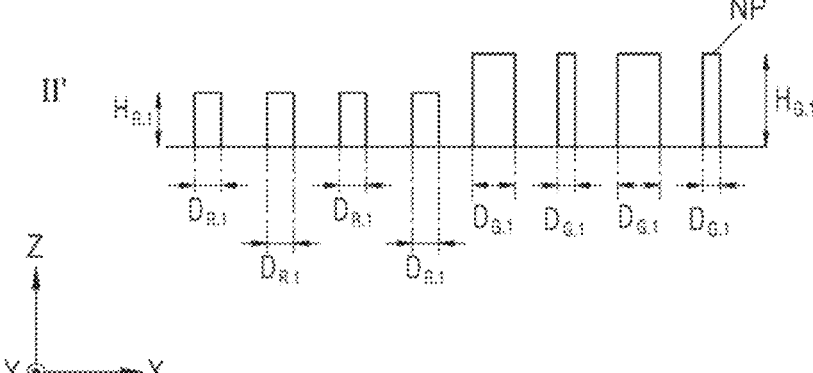

FIG. 10A is a diagram that shows the rules of the plurality of nanoposts provided in the unit color filter $CFG_1$ with a value of $CRA_1$, and FIG. 10B is a diagram that shows the I'-I' cross-section and II'-II' cross-section of FIG. 10A.

Referring to FIGS. 10A and 10B, the unit color filter $CFG_1$ with a value of $CRA_1$ may include first to fourth color filters CF1, CF2, CF3, and CF4. Spectral changes caused by oblique light in incident light may be compensated for by adjusting at least one of the diameters and heights of the plurality of nanoposts NP provided in the unit color filter $CFG_1$. For example, each of the plurality of nanoposts NP provided in the unit color filter $CFG_1$ with a value of $CRA_1$ may have the same diameter as or a diameter less than each of the plurality of nanoposts NP provided in the unit color filter $CFG_0 >$ with a value of $CRA_0$ and the former may have the same height as or a height greater than the latter. Hereinafter, differences between FIGS. 9A and 9B will be mainly described.

The green color filters CF1 and CF4 included in the unit color filter $CFG_1$ with a value of $CRA_1$ may include the plurality of nanoposts NP each having a diameter $D_{G,1}$ and a height $H_{G,1}$, and the plurality of nanoposts NP each having a diameter $D_{G,1}'$ and a height $H_{G,1}$ less than $D_{G,1}$. In this case, the plurality of nanoposts NP of the first color filter CF1 and the fourth color filter CF4 included in the unit color filter $CFG_1$ with the value of $CRA_1$ of FIGS. 10A and 10B may have the same diameters as or diameters less than the plurality of nanoposts NP of the green color filters CF1 and CF4 included in the unit color filter $CFG_0$ with the value of $CRA_0$ of FIGS. 9A and 9B, and the former may have the same heights as or heights less than the latter. That is, $D_{G,1} \leq D_{G,0}$, $D_{G,1}' \leq D_{G,0}'$, and $H_{G,1} \leq H_{G,0}$.

The blue color filter CF2 included in the unit color filter $CFG_1$ with a value of $CRA_1$ may include the plurality of nanoposts NP each having a diameter $D_{B,1}$ and a height $H_{B,1}$. In this case, diameters of the plurality of nanoposts NP of the blue color filter CF2 included in the unit color filter $CFG_1$ with the value of $CRA_1$ of FIGS. 10A and 10B may less than or equal to diameters of the plurality of nanoposts NP of the blue color filter CF2 included in the unit color filter $CFG_0$ with the value of $CRA_0$ of FIGS. 9A and 9B, and heights of the former may greater than or equal to heights of the latter. That is, $D_{B,1} \leq D_{B,0}$ and $H_{B,1} \geq H_{B,0}$.

The red color filter CF3 included in the unit color filter $CFG_1$ with a value of $CRA_1$ may include the plurality of nanoposts NP each having a diameter $D_{R,1}$ and a height $H_{R,1}$. In this case, diameters of the plurality of nanoposts NP of the red color filter CF3 included in the unit color filter $CFG_1$ with the value of $CRA_1$ of FIGS. 10A and 10B may be less than or equal to diameters of the plurality of nanoposts NP of the red color filter CF3 included in the unit color filter $CFG_0$ with the value of $CRA_0$ of FIGS. 9A and 9B, and heights of the former may be greater than or equal to heights of the latter. That is, $D_{R,1} \leq D_{R,0}$ and $H_{R,1} \leq H_{R,0}$.

Figure 11A:
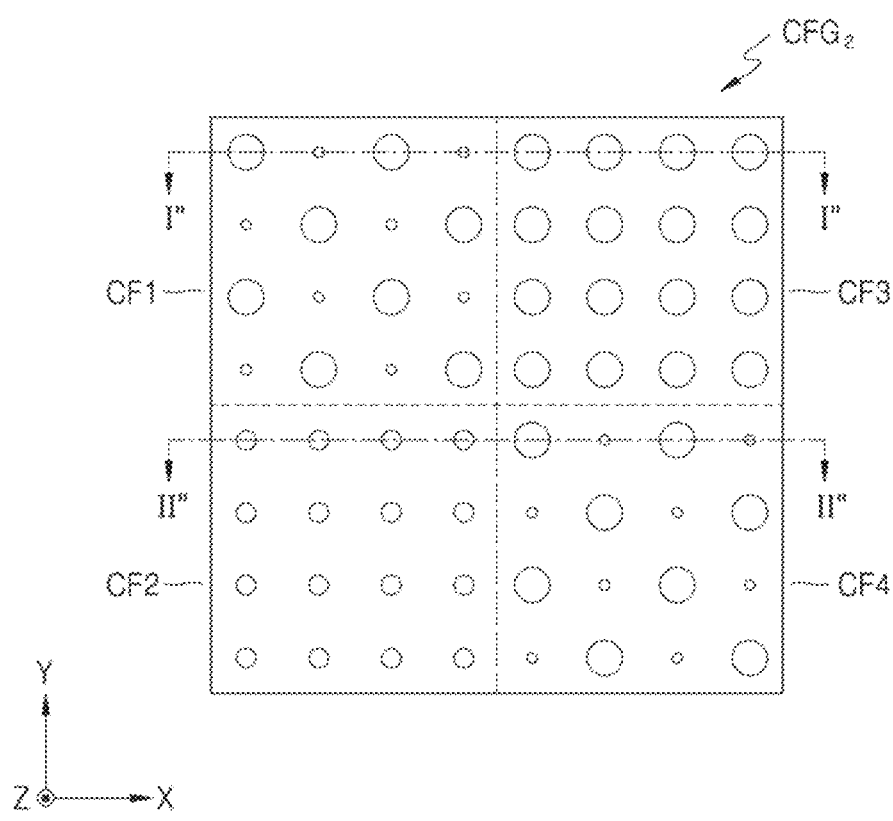
Figure 11B:
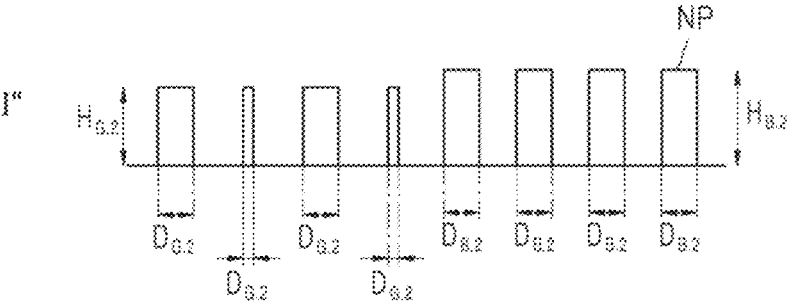
Figure 11B:
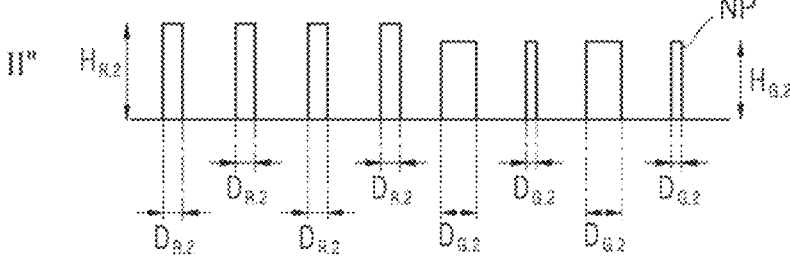
Figure 11B:

FIG. 11A is a diagram that shows the rules of the plurality of nanoposts provided in the unit color filter $CFG_2$ with a value of $CRA_2$, and FIG. 11B is a diagram that shows the I"-I" cross-section and II"-II" cross-section of FIG. 11A.

Referring to FIGS. 11A and 11B, the unit color filter $CFG_2$ with a value of $CRA_2$ may include first to fourth color filters CF1, CF2, CF3, and CF4. Spectral changes caused by oblique light in incident light may be compensated for by adjusting at least one of the diameters and heights of the plurality of nanoposts NP provided in the unit color filter $CFG_2$. For example, a diameter of each of the plurality of nanoposts NP provided in the unit color filter $CFG_2$ with a value of $CRA_2$ may be greater than a diameter of each of the plurality of nanoposts NP provided in the unit color filter $CFG_1 >$ with a value of $CRA_1$ for each color and a height of the former may be less than or greater than a height of the latter. Hereinafter, differences between FIGS. 10A and 10B will be mainly described.

The green color filters CF1 and CF4 included in the unit color filter $CFG_2$ with a value of $CRA_2$ may include the plurality of nanoposts NP each having a diameter $D_{G,2}$ and a height $H_{G,2}$. In addition, the green color filters CF1 and CF4 may include the plurality of nanoposts NP each having a diameter $D_{G,2}'$ and a height $H_{G,2}$ less than $D_{G,2}$. In this case, diameters of the plurality of nanoposts NP of the first color filter CF1 and the fourth color filter CF4 included in the unit color filter $CFG_2$ with the value of $CRA_2$ of FIGS. 11A and 11B may be less than or equal to diameters of the plurality of nanoposts NP of the green color filters CF1 and CF4 included in the unit color filter $CFG_1$ with the value of $CRA_1$ of FIGS. 10A and 10B, and heights of the former may be less than or equal to heights of the latter. For example, $D_{G,2} \leq D_{G,1}$, $D_{G,2}' \leq D_{G,1}'$, and $H_{G,2} \leq H_{G,1}$.

The blue color filter CF2 included in the unit color filter $CFG_2$ with a value of $CRA_2$ may include the plurality of nanoposts NP each having a diameter $D_{B,2}$ and a height $H_{B,2}$. In this case, diameters of the plurality of nanoposts NP of the blue color filter CF2 included in the unit color filter $CFG_2$ with the value of $CRA_2$ of FIGS. 11A and 11B may be same or similar to diameters of the plurality of nanoposts NP of the blue color filter CF2 included in the unit color filter $CFG_1$ with the value of $CRA_1$ of FIGS. 10A and 10B, and heights of the former may be greater than or equal to heights of the latter. For example, $D_{B,2} \cong D_{B,1}$ and $H_{B,2} \geq H_{B,1}$.

The red color filter CF3 included in the unit color filter $CFG_2$ with a value of $CRA_2$ may include the plurality of nanoposts NP each having a diameter $D_{R,2}$ and a height $H_{R,2}$. In this case, diameters of the plurality of nanoposts NP of the red color filter CF3 included in the unit color filter $CFG_2$ with the value of $CRA_2$ of FIGS. 11A and 11B may be less than or equal to diameters of the plurality of nanoposts NP of the red color filter CF3 included in the unit color filter $CFG_1$ with the value of $CRA_1$ of FIGS. 10A and 10B, and heights of the former may be greater than or equal to heights of the latter. For example, $D_{R,2} \leq D_{R,1}$ and $H_{R,2} \geq H_{R,1}$.

The plurality of nanoposts NP provided in the color filter may have different change values in diameter D and height H according to the CRA value for each color, and in one example, the amount of change in diameter D of the plurality of nanoposts NP according to an increase in the CRA value may be greater than the amount of change in height H thereof.

For example, the change values in diameter and height according to the CRA value for each color (R, G, B) of the plurality of nanoposts NP provided in the color filter may be as shown in Table 1 below.

TABLE 1

| CRA | 0° | | 10° | | 30° | |
|---|---|---|---|---|---|---|
| | Diameter (D) (nm) | Height (H) (nm) | Diameter (D) (nm) | Height (H) (nm) | Diameter (D) (nm) | Height (H) (nm) |
| R | 105 | 135 | 102.5 | 123 | 100 | 130 |
| G | 190 & 100 | 295 | 190 & 100 | 288 | 181 & 91 | 286 |
| B | 170 | 75 | 158 | 87 | 158 | 97 |

| | | 10° | | 30° | |
|---|---|---|---|---|---|
| | | ΔDiameter (D) (nm) | ΔHeight (H) (nm) | ΔDiameter (D) (nm) | ΔHeight (H) (nm) |
| CRA 0° Comparison | R | -2.5 | -12 | -5 | -5 |
| | G | 0 | -7 | -9 | -9 |
| | B | -12 | +12 | -12 | +22 |

Referring to Table 1 above, the plurality of nanoposts NP provided in the color filter may have different change values in diameters and heights according to the CRA value for each color. For example, as the CRA value increases from 0° to 10°, the amount of reduction in diameters (D) of the plurality of nanoposts in the blue (B) color filter may be configured to be greater than or equal to the amount of reduction in diameters (D) of the plurality of nanoposts in the green (G) color filter and red (R) color filter. As the CRA value increases from 0° to 10°, the amount of change in heights (H) of the plurality of nanoposts provided in the blue (B) color filter and the red (R) color filter may be configured to be greater than or equal to the amount of increase in heights (H) of the plurality of nanoposts provided in the green (G) color filter.

In the red (R) color filter, the amount of change in diameters (D) of the plurality of nanoposts NP in accordance with the increase in the CRA value from 0° to 10° may be less than or equal to the amount of change in heights (H) the plurality of nanoposts NP. The plurality of nanoposts NP provided in the red (R) color filter having a CRA value of 10° may be configured to have a diameter (D) reduced by 2.5 nm and a height (H) reduced by 12 nm as compared to the plurality of nanoposts NP provided in the red (R) color filter having a CRA value of 0°. The plurality of nanoposts NP provided in the red (R) color filter having a CRA value of 30° may be configured to have a diameter (D) reduced by 5 nm and a height (H) reduced by 5 nm as compared to the plurality of nanoposts NP provided in the red (R) color filter having a CRA value of 0°.

In the blue (B) color filter, the amount of change in diameters (D) of the plurality of nanoposts NP in accordance with the CRA value may be less than or equal to the amount of change in heights (H) the plurality of nanoposts NP. The plurality of nanoposts NP provided in the blue (B) color filter having a CRA value of 10° may be configured to have a diameter (D) reduced by 12 nm and a height (H) increased by 12 nm as compared to the plurality of nanoposts NP provided in the blue (B) color filter having a CRA value of 0°. The plurality of nanoposts NP provided in the blue (B) color filter having a CRA value of 30° may be configured to have a diameter (D) reduced by 12 nm and a height (H) increased by 22 nm as compared to the plurality of nanoposts NP provided in the blue (B) color filter having a CRA value of 0°.

In the green (G) color filter, the amount of change in diameters (D) of the plurality of nanoposts NP in accordance with the CRA value may be similar to the amount of change in heights (H) the plurality of nanoposts NP. The plurality of nanoposts NP provided in the green (G) color filter having a CRA value of 10° may be configured to have the same diameter (D) and a height (H) reduced by 7 nm as compared to the plurality of nanoposts NP provided in the green (G) color filter having a CRA value of 0°. The plurality of nanoposts NP provided in the green (G) color filter having a CRA value of 30° may be configured to have a diameter (D) reduced by 9 nm and a height (H) reduced by 9 nm as compared to the plurality of nanoposts NP provided in the green (G) color filter having a CRA value of 0°.

FIGS. 12A to 12D are diagrams illustrating various example embodiments of rules in which nanoposts are arranged. The plurality of nanoposts of the color filters may have a square pattern or a hexagonal pattern within each color filter.

Figure 12A:
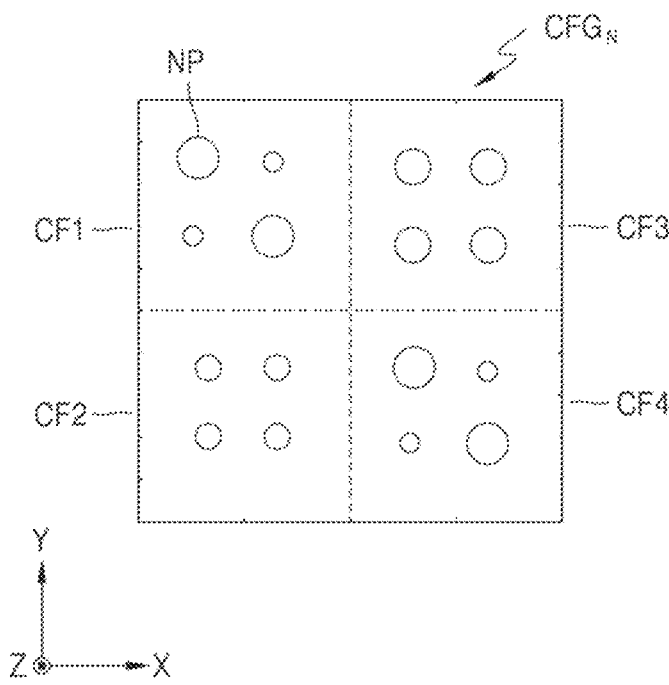
FIGS. 12A, 12B, 12C, and 12D are diagrams illustrating nanoposts arranged based on various rules, according to an example embodiment.
Figure 12B:
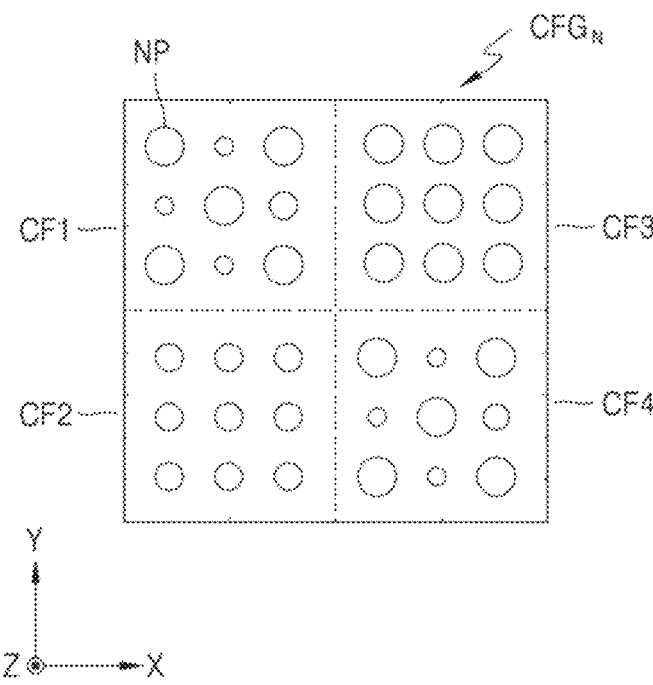
Figure 12C:
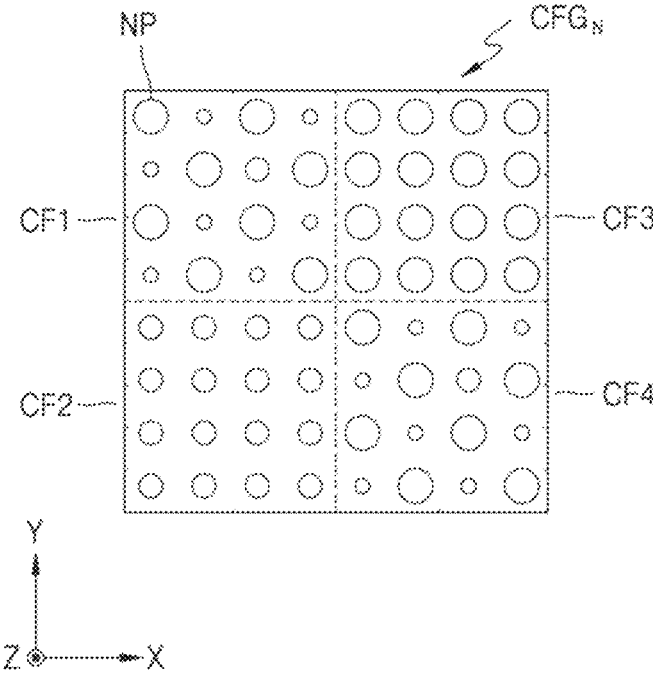
Figure 12D:
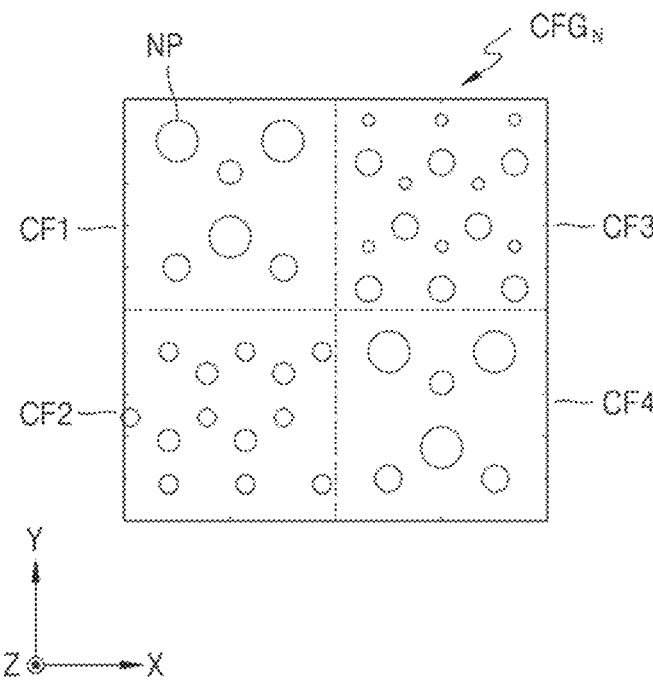

Referring to FIG. 12A, the plurality of nanoposts NP of color filters CF1, CF2, CF3, and CF4 may be provided in a 2×2 square pattern in each color filter. Referring to FIG. 12B, the plurality of nanoposts NP of color filters CF1, CF2, CF3, and CF4 may be provided in a 3×3 square pattern in each color filter. Referring to FIG. 12C, the plurality of nanoposts NP of color filters CF1, CF2, CF3, and CF4 may be provided in a 4×4 square pattern in each color filter. The plurality of nanoposts of the color filters may be provided in an N×N square pattern in each color filter (N is a number of two or more). Referring to FIG. 12D, the plurality of nanoposts NP of color filters CF1, CF2, CF3, and CF4 may be provided in a hexagonal pattern in each color filter. In addition to the plurality of nanoposts NP of green color filters CF1 and CF4, the plurality of nanoposts NP of blue and red color filters CF2 and CF3 may also be provided in different diameter combinations within each color.

Figure 13:
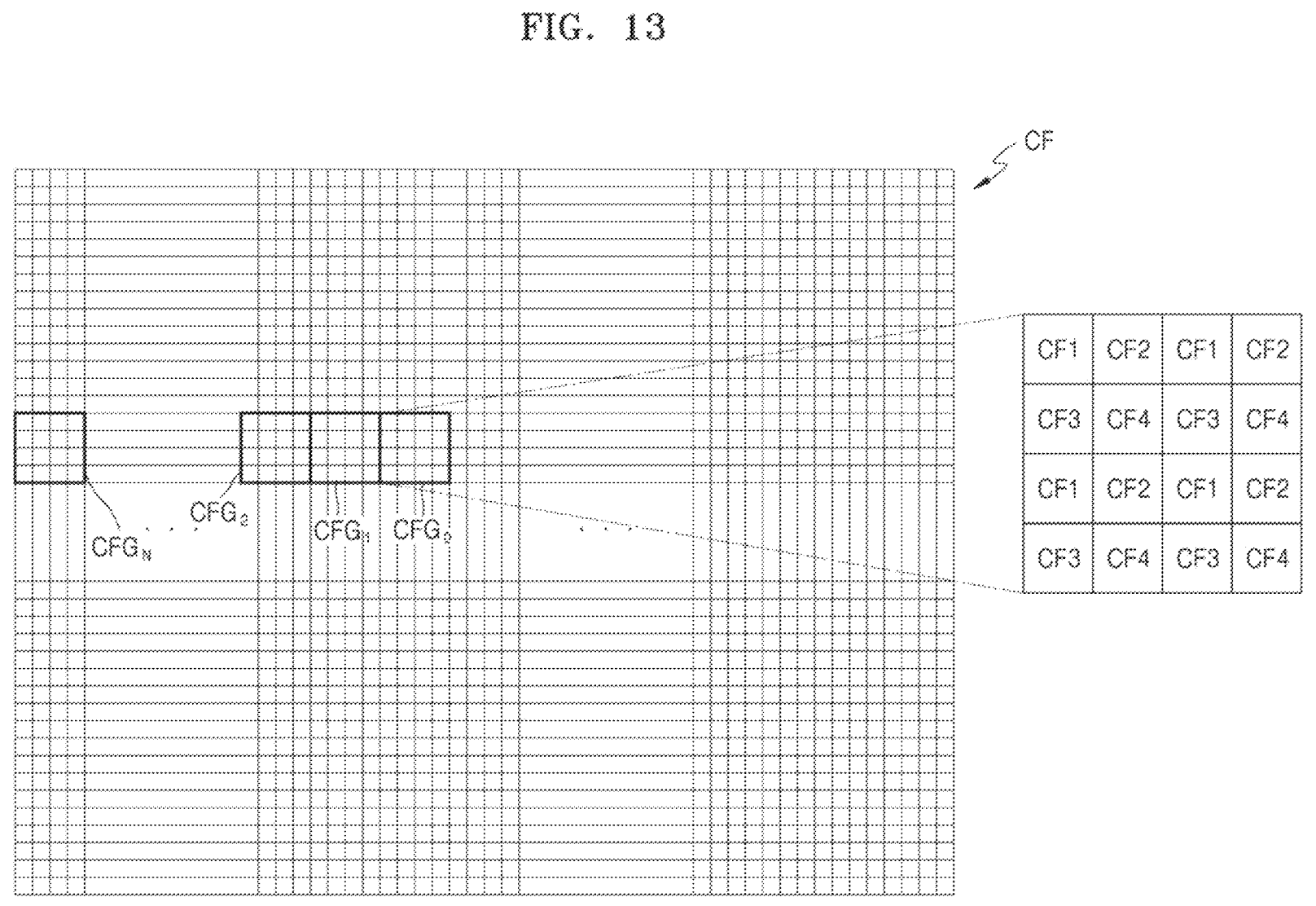

FIG. 13 is a diagram illustrating an example embodiment of a color filter array of an image sensor.

Referring to FIG. 13, the color filter array may include unit color filters $GFG_0$, $GFG_1$, $GFG_2$, . . . , and $GFG_N$. Although it is shown in FIGS. 9A to 12D that each of the unit color filters $GFG_0$, $GFG_1$, $GFG_2$, . . . , and $GFG_N$ includes 2×2 color filters, each of the unit color filters $GFG_0$, GFG$_1$, GFG$_2$, . . . , and GFG$_N$ may include N×N color filters (N is an even number). For example, each of the unit color filters GFG$_0$, GFG$_1$, GFG$_2$, . . . , and GFG$_N$ may include 4×4 color filters as shown in FIG. 13.

Each of the unit color filters GFG$_0$, GFG$_1$, GFG$_2$, . . . , and GFG$_N$ may include the plurality of nanoposts NP for each color, and the rules of the plurality of nanoposts NP may be applied equally for each color of each color filter in the unit color filter. For example, the arrangements, diameters, and heights of the plurality of nanoposts NP in the green color filter in the central unit color filter GFG$_0$ may be the same, respectively. In addition, the arrangements, diameters, and heights of the plurality of nanoposts NP in the blue color filter in the central unit color filter GFG$_0$ may be the same, respectively, and the arrangements, diameters, and heights of the plurality of nanoposts NP in the red color filter in the central unit color filter GFG$_0$ may be the same, respectively.

Figure 14:
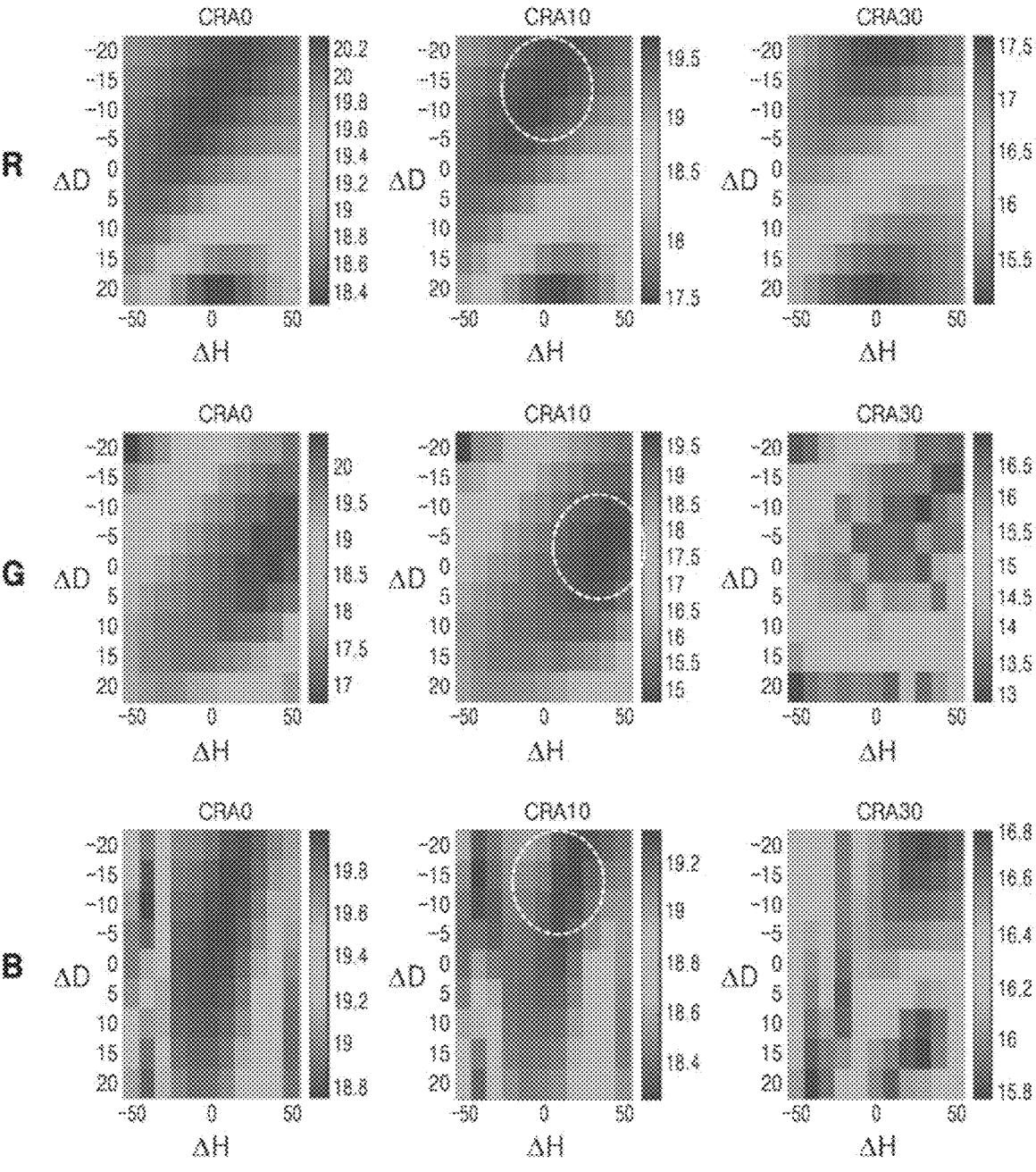
FIG. 14 is a graph showing a luminance signal to noise ratio (YSNR) according to a change in diameter and height of nanoposts for each color of a color filter according to a CRA value.

FIG. 14 is a graph showing a luminance signal to noise ratio (YSNR) according to changes in the diameters and heights of nanoposts for each color of a color filter according to a CRA value.

The YSNR and color crosstalk of the image sensor and the electronic device including the image sensor may be improved according to the changes in diameters and heights of the nanoposts for each color of the color filter according to the CRA value, and it is possible to increase light efficiency in the entire area of the image sensor by having an RGB spectrum required by a user regardless of the oblique light.

The image sensor having the color separating lens array described above have been described with reference to the example embodiments shown in the drawings, but this is only an example, and those of ordinary skill in the art will understand that various modifications and equivalent other embodiments are possible. Therefore, the example embodiments should be considered from an explanatory point of view rather than a limiting point of view. The scope of the right is defined not by the detailed description but by the appended claims, and all differences within the scope will be construed as being included in the scope of the right.

The image sensor 1000, which includes a pixel array 1100 including the color separating lens array 130 described above, may have little light loss by a color filter, for example, an organic color filter, and may provide a sufficient amount of light to the pixel even when the pixel size is relatively small. Therefore, it is possible to manufacture ultra-high-resolution ultra-small high-sensitivity image sensors with hundreds of millions of pixels or more. Such ultra-high-resolution ultra-small high-sensitivity image sensors may be employed in various high-performance optical devices or high-performance electronic devices. The electronic devices may be, for example, smart phones, mobile phones, portable phones, personal digital assistants (PDAs), laptops, personal computers (PCs), various portable devices, home appliances, security cameras, medical cameras, vehicles, Internet of Things (IoT) devices, augmented reality (AR) devices, virtual reality (VR) devices, various types of extended reality devices that expand the user's experience, other mobile or non-mobile computing devices, and are not limited thereto.

In addition to the image sensor 1000, the electronic device may further include a processor that controls the image sensor, for example, an application processor (AP), and may drive an operating system or application program, through the processor, to control a number of hardware or software components and perform various data processes and operations. The processor may further include a graphical processing unit (GPU) and/or an image signal processor. When an image signal processor is included in the processor, an image (or video) obtained by the image sensor may be stored and/or output using the processor.

Figure 15:
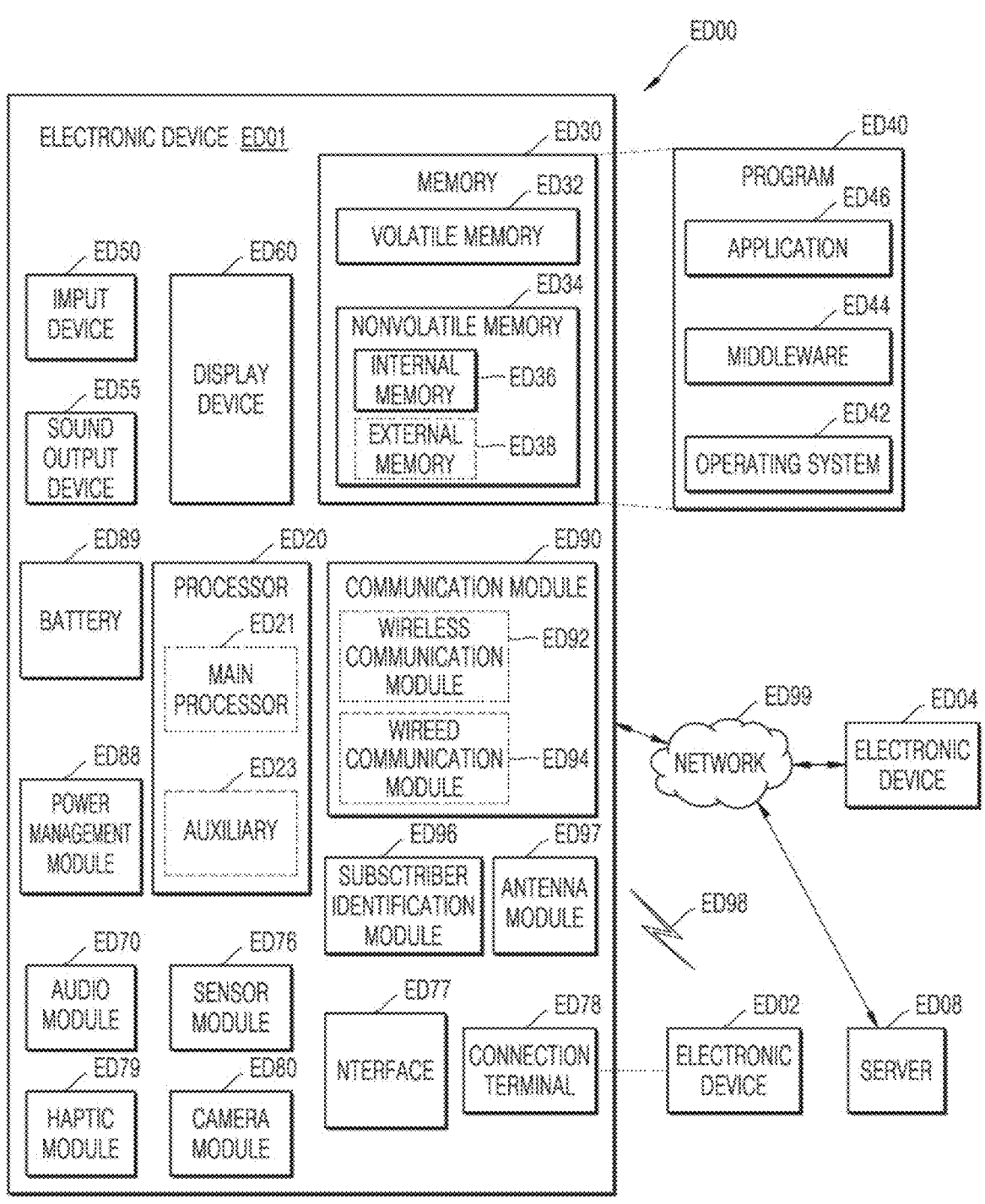
FIG. 15 is a block diagram schematically illustrating an electronic device including an image sensor, according to example embodiments.

FIG. 15 is a block diagram illustrating an electronic device including an image sensor according to embodiments.

Referring to FIG. 15, under a network environment ED00, the electronic device ED01 may communicate with another electronic device ED02 via a first network ED98 (a short-range wireless communication network, etc.), or may communicate with another electronic device ED04 and/or a server ED08 via a second network ED99 (a long-range wireless communication network, etc.). The electronic device ED01 may communicate with the electronic device ED04 through the server ED08. The electronic device ED01 may include a processor ED20, a memory ED30, an input device ED50, an audio output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. Some (the display device ED60, and the like) of these components may be omitted from or other components may be added to the electronic apparatus ED01. Some of these components may be implemented as one integrated circuit. For example, the sensor module ED76 (fingerprint sensor, iris sensor, illuminance sensor, etc.) may be implemented by being embedded in the display device ED60 (display, etc.).

The processor ED20 may execute software (program ED40 or the like) to control one or a plurality of other components (hardware, software components, etc.) of the electronic apparatus ED01 connected to the processor ED20, and may perform various data processing or operations. As part of data processing or operation, the processor ED20 may load commands and/or data received from other components (sensor modules ED76, communication modules ED90, etc.), process commands and/or data stored in volatile memory ED32, and store the result data in nonvolatile memory ED34 including an internal memory ED36 and an external memory ED38. The processor ED20 may include a main processor ED21 (a central processing unit, an application processor, etc.) and an auxiliary processor ED23 (a graphics processing unit, an image signal processor, a sensor hub processor, a communication processor, etc.) that may be operated independently of or together with the main processor ED21. The auxiliary processor ED23 may use less power than the main processor ED21 and perform a specialized function.

The auxiliary processor ED23 may control the functionality and/or status associated with some of the components of the electronic apparatus ED01 (the display device ED60, the sensor module ED76, the communication module ED90, etc.), in place of the main processor ED21 while the main processor ED21 is in an inactive state (sleep state), or in conjunction with the main processor ED21 while the main processor ED21 is in an active state (application execution state). The auxiliary processor ED23 (image signal processor, communication processor, etc.) may be implemented as part of other functionally related components (camera module ED80, communication module ED90, etc.).

The memory ED30 may store various data required by components (processor ED20 and sensor module ED76) of the electronic apparatus ED01. The data may include, for example, input data and/or output data for software (program ED40 or the like) and related commands. The memory ED30 may include a volatile memory ED32 and/or a non-volatile memory ED34.

The program ED40 may be stored in the memory ED30 as software, and may include an operating system ED42, middleware ED44, and/or an application ED46.

The input device ED50 may receive commands and/or data to be used in components (processor ED20, etc.) of the electronic apparatus ED01 from the outside (user, etc.) of the electronic apparatus ED01. The input device ED50 may include a microphone, a mouse, a keyboard, and/or a digital pen (such as a stylus pen).

The sound output device ED55 may output the sound signal to the outside of the electronic apparatus ED01. The sound output device ED55 may include a speaker and/or a receiver. Speakers may be used for general purposes such as multimedia playback or recording playback, and receivers may be used to receive incoming calls. The receiver may be coupled as part of a speaker or may be implemented as an independent separate device.

The display device ED60 may visually provide information to the outside of the electronic apparatus ED01. The display device ED60 may include a display, a hologram device, or a projector and a control circuit for controlling the corresponding device. The display device ED60 may include a touch circuit configured to sense a touch, and/or a sensor circuit (a pressure sensor, etc.) configured to measure an intensity of a force generated by the touch.

The audio module ED70 may convert sound into an electrical signal or conversely convert the electrical signal into sound. The audio module ED70 may acquire sound through the input device ED50 or output sound through the sound output device ED55 and/or a speaker and/or a head-phone of another electronic apparatus (e.g., electronic apparatus ED02, etc.) directly or wirelessly connected to the electronic apparatus ED01.

The sensor module ED76 may detect an operating state (power, temperature, etc.) or an external environmental state (user state, etc.) of the electronic apparatus ED01 and generate an electrical signal and/or a data value corresponding to the sensed state. The sensor module ED76 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illumination sensor.

The interface ED77 may support one or more designated protocols that may be used for electronic apparatus ED01 to be directly or wirelessly connected to another electronic apparatus (e.g., electronic apparatus ED02, etc.). The interface ED77 may include a high definition multimedia interface (HDMI), a universal serial bus (USB) interface, an SD card interface, and/or an audio interface.

The connection terminal ED78 may include a connector through which the electronic apparatus ED01 may be physically connected to another electronic apparatus (e.g., electronic apparatus ED02, etc.). The connection terminal ED78 may include an HDMI connector, a USB connector, an SD card connector, and/or an audio connector (such as a head-phone connector, etc.).

The haptic module ED79 may convert an electrical signal to a mechanical stimulus (vibration, motion, etc.) or an electrical stimulus that a user can recognize through a tactile or motion sensation. The haptic module ED79 may include a motor, a piezoelectric element, and/or an electrical stimulus.

The camera module ED80 may capture a still image and a moving image. The camera module ED80 may include a lens assembly including one or more lenses, the image sensor 1000 described above, image signal processors, and/or or flashes. The lens assembly included in the camera module ED80 may collect light emitted from an object to be photographed.

The power management module ED88 may manage power supplied to the electronic apparatus ED01. The power management module ED88 may be implemented as part of a power management integrated circuit (PMIC).

The battery ED89 may supply power to components of the electronic apparatus ED01. The battery ED89 may include a non-rechargeable primary battery, a rechargeable secondary battery, and/or a fuel cell.

The communication module ED90 may establish a direct (wired) communication channel and/or wireless communication channel between the electronic apparatus ED01 and another electronic apparatus (the electronic apparatus ED02, the electronic apparatus ED04, the server ED08, etc.), and support communication execution through the established communication channel. The communication module ED90 may include one or more communication processors that operate independently of the processor ED20 (application processor, etc.) and support direct communication and/or wireless communication. The communication module ED90 may include a wireless communication module ED92 (a cellular communication module, a short-range wireless communication module, a GNSS (Global Navigation Satellite System, etc.) communication module, and/or a wired communication module ED94 (a local area network (LAN) communication module, a power line communication module, etc.). A corresponding communication module of these communication modules may communicate with other electronic apparatuses through a first network ED98 (a short-range communication network such as Bluetooth, WiFi Direct, or infrared data association (IrDA)), or a second network ED99 (a long-range communication network such as a cellular network, Internet, or computer network (LAN, WAN, etc.)). These various types of communication modules may be integrated into a single component (such as a single chip, etc.), or may be implemented as a plurality of separate components (multiple chips). The wireless communication module ED92 may identify and authenticate the electronic apparatus ED01 in a communication network such as a first network ED98 and/or a second network ED99 using subscriber information (such as an international mobile subscriber identifier (IMSI) stored in the subscriber identification module ED96.

The antenna module ED97 may transmit a signal and/or power to the outside (such as another electronic apparatus, etc.) or receive the signal and/or power from the outside. The antenna may include a radiator formed of a conductive pattern formed on the substrate (PCB, etc.). The antenna module ED97 may include one or a plurality of antennas. When a plurality of antennas are included, an antenna suitable for a communication scheme used in a communication network such as a first network ED98 and/or a second network ED99 may be selected from among the plurality of antennas by the communication module ED90. A signal and/or power may be transmitted or received between the communication module ED90 and another electronic apparatus through the selected antenna. Other components (RFIC, etc.) in addition to the antenna may be included as a part of the antenna module ED97.

Some of the components may be connected to each other via communication methods between peripherals (such as buses, General Purpose Input and Output (GPIO), Serial Peripheral Interface (SPI), and Mobile Industry Processor Interface (MIPI), etc.) to interchange signals (commands, data, etc.).

The command or data may be transmitted or received between the electronic apparatus ED01 and the external electronic apparatus ED04 through the server ED08 connected to the second network ED99. Other electronic apparatuses ED02 and ED04 may be the same or different types of apparatuses as the electronic apparatus ED01. All or some of the operations executed in the electronic apparatus ED01 may be executed in one or more of the other electronic apparatuses ED02, ED04, and ED08. For example, when the electronic apparatus ED01 needs to perform a function or service, it may request one or more other electronic apparatuses to perform part or all of the function or service instead of executing the function or service on its own. One or more other electronic apparatuses receiving the request may execute an additional function or service related to the request and transmit a result of the execution to the electronic apparatus ED01. To this end, cloud computing, distributed computing, and/or client-server computing technology may be used.

Figure 16:
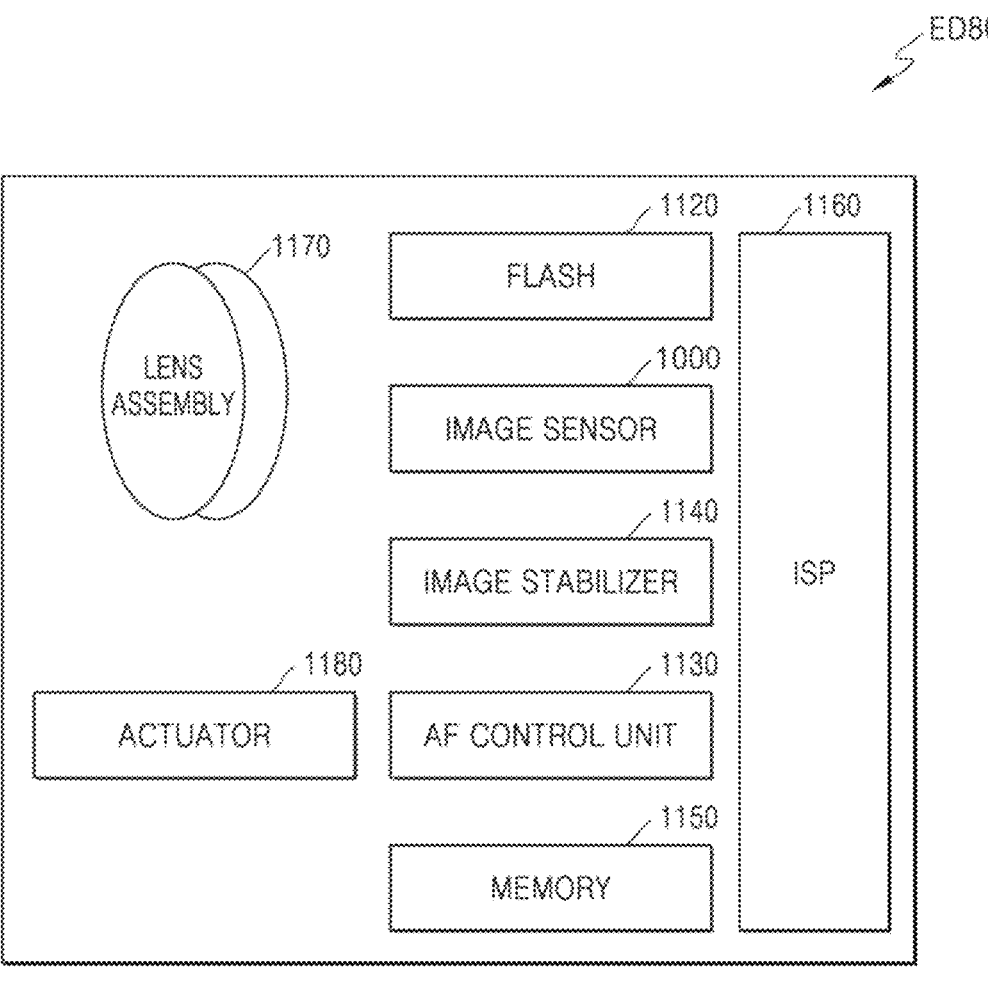
FIG. 16 is a block diagram illustrating a camera module provided in an electronic device, according to an example embodiment.

FIG. 16 is a block diagram illustrating a camera module ED80 provided in the electronic device of FIG. 15.

Referring to FIG. 16, the camera module ED80 may include a lens assembly 1170, a flash 1120, an image sensor 1000, an image stabilizer 1140, an auto-focus (AF) control unit 1130, a memory 1150 (buffer memory, etc.), an actuator 1180 and/or an image signal processor (ISP) 1160.

The lens assembly 1170 may collect light emitted from a subject to be imaged. The lens assembly 1170 may include one or more optical lenses. The lens assembly 1170 may include a path change member that changes the path of light to face the image sensor 1000. Depending on the arrangement of the path change member and the arrangement form with respect to the optical lens, the camera module ED80 may have a vertical form or a folded form. The camera module ED80 may include a plurality of lens assemblies 1170, and in this case, the camera module ED80 may be a dual camera, a 360-degree camera, or a spherical camera. Some of the plurality of lens assemblies 1170 may have the same lens properties (view angle, focal length, auto-focus, F Number, optical zoom, etc.), or may have different lens properties. The lens assembly 1170 may include a wide-angle lens or a telephoto lens.

The actuator 1180 may drive the lens assembly 1170. For example, at least one of the optical lenses and path change member constituting the lens assembly 1170 may move by the actuator 1180. The optical lens may move along the optical axis and adjust the distance between adjacent lenses by moving at least part of the optical lenses included in the lens assembly 1170, thereby adjusting an optical zoom ratio.

The actuator 1180 may adjust the position of any one optical lens included in the lens assembly 1170 so that the image sensor 1000 is located at the focal length of the lens assembly 1170. The actuator 1180 may drive the lens assembly 1170 according to an AF driving signal transmitted from the AF control unit 1130.

The flash 1120 may emit light used to enhance light emitted or reflected from the subject. The flash 1120 may emit visible light or infrared light. The flash 1120 may include one or more light emitting diodes (RGB (Red-Green-Blue) LED, White LED, Infrared LED, Ultraviolet LED, etc.), and/or Xenon Lamps. The image sensor 1000 may be the image sensor 1000 described in FIG. 1 or may have a modified shape. The image sensor 1000 may convert light emitted or reflected from a subject and transmitted through the lens assembly 1170 into an electrical signal, and obtain an image corresponding to the subject.

The image sensor 1000 is equipped with the color separating lens array 130 described above, and as the lens assembly 1170 is thinned, and thus, the CRA incident on the image sensor 1000 increases, the image sensor 1000 may be used to increase light efficiency. Each pixel may include a plurality of photo-sensing cells forming a plurality of channels, for example, a plurality of photo-sensing cells arranged in a 2×2 arrangement. All or some of these pixels may be used as AF pixels, and the image sensor 1000 may generate AF driving signals from signals from a plurality of channels in the AF pixels.

In response to the movement of the camera module ED80 or the electronic device ED01 including the same, the image stabilizer 1140 may move the one or more lenses or the image sensor 1000 included in the lens assembly 1170 in a specific direction or control an operation characteristic (adjustment of read-out timing and the like) of the image sensor 1000 to compensate for a negative impact caused by the movement. The image stabilizer 1140 may detect the movement of the camera module ED80 or the electronic device ED01 by using a gyro sensor (not shown) or an acceleration sensor (not shown) arranged inside or outside the camera module ED80. The image stabilizer 1140 may be implemented optically.

The AF control unit 1130 may generate an AF driving signal from a signal value sensed from the AF pixels of the image sensor 1000. The AF control unit 1130 may control the actuator 1180 according to the AF driving signal.

The memory 1150 may store some or all data of an image acquired through the image sensor 1000 for a next image processing operation. For example, when multiple images are acquired at high speed, the acquired original data (Bayer-Patterned data, high-resolution data, etc.) may be stored in the memory 1150, and used to allow only low-resolution images to displayed, and then the original data of the selected image (user selection, or the like) to be transferred to the image signal processor 1160. The memory 1150 may be integrated into the memory ED30 of the electronic device ED01, or may be configured as a separate memory that operates independently.

The ISP 1160 may perform image processes on image obtained through the image sensor 1000 or image data stored in the memory 1150. The image processes may include depth map generation, three-dimensional modeling, panorama generation, feature point extraction, image synthesis, and/or image compensation (noise reduction, resolution adjustment, brightness adjustment, blurring interpolation, sharpening, softening, etc.). The image signal processor 1160 may perform control (exposure time control, read-out timing control, etc.) on components (image sensor 1000, etc.) included in the camera module ED80. The image processed by the ISP 1160 may be re-stored in the memory 1150 for further processing or may be provided to an external component of the camera module ED80 (memory ED30, display device ED60, electronic device ED02, electronic device ED04, server ED08, etc.). The ISP 1160 may be integrated into the processor ED20 or may be configured as a separate processor that operates independently of the processor ED20. When the ISP 1160 is configured as a separate processor from the processor ED20, the image processed by the ISP 1160 may be displayed through the display device ED60 after additional image processing by the processor ED20.

The AF control unit 1130 may be integrated into the image signal processor 1160. The ISP 1160 processes signals from the auto-focusing pixels of the image sensor 1000 to generate AF signals, and the AF control unit 1130 may convert the AF signals into drive signals for driving the actuator 1180 and transmit the same to the actuator 1180.

The image sensor 1000 according to embodiments may be applied to various electronic devices.

The image sensor 1000 according to embodiments may be applied to mobile phones or smartphones, tablets or smart tablets, augmented reality (AR) devices, virtual reality (VR) devices, various types of extended reality devices that expand the user's experience, digital cameras or video cassette recorders referred to as camcorders, laptop computers or televisions, or smart televisions. For example, smartphones or smart tablets, augmented reality (AR) devices, virtual reality (VR) devices, and various types of extended reality devices that expand the user's experience may each include a plurality of high-resolution cameras equipped with high-resolution image sensors. It is possible to extract depth information of subjects in an image, adjust outfocusing of the image, or automatically identify subjects in the image using high-resolution cameras.

In addition, the image sensor 1000 may be applied to a smart refrigerator, a security camera, a robot, a medical camera, and the like. For example, the smart refrigerator may automatically recognize food in the refrigerator using an image sensor and inform a user of the presence of a specific food, the type of food that is received or released, and the like through a smartphone. The security camera may provide an ultra-high-resolution image and may enable recognition of objects or people in the image even in a dark environment by using high sensitivity. The robot may be provided into a disaster or industrial site that is not directly accessible by humans to provide a high-resolution image. The medical camera may provide a high-resolution image for diagnosis or surgery and may dynamically adjust the field of view.

In addition, the image sensor 1000 may be applied to a vehicle. The vehicle may include a plurality of vehicle cameras arranged at various positions. Each vehicle camera may include the image sensor according to an embodiment. The vehicle may provide the driver with various information about the inside or surroundings of the vehicle using a plurality of vehicle cameras, and may automatically recognize objects or people in the image to provide information necessary for autonomous driving.

The image sensor including the color separating lens array described above and the electronic device including the same have been described with reference to the embodiments illustrated in the drawings.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:
a sensor substrate comprising a plurality of unit pixels;

a plurality of unit color filters on the sensor substrate, at least one unit color filter of the plurality of unit color filters comprising a plurality of nanoposts;

a color separating lens array on the plurality of unit color filters, the color separating lens array being configured to separate and condense incident light based on a wavelength of the incident light; and a spacer layer between the sensor substrate and the color separating lens array, wherein at least one of a diameter and a height of the plurality of nanoposts provided in the at least one unit color filter of the plurality of unit color filters in regions are different from each other based on values of a chief ray angle (CRA) corresponding to the regions.

2. The image sensor of claim 1, wherein the at least one unit color filter comprises of the plurality of unit color filters comprises a first unit color filter in an area where a value of the CRA is a first value and a second unit color filter in an area where a value of the CRA is a second value that is greater than the first value, and wherein diameters of the plurality of nanoposts in the second unit color filter are less than diameters of the plurality of nanoposts in the first unit color filter.

3. The image sensor of claim 2, wherein the at least one unit color filter of the plurality of unit color filters comprises a green color filter, a red color filter, and a blue color filter, and a reduction of diameters of the plurality of nanoposts in the red color filter is greater than a reduction of diameters of the plurality of nanoposts in the green color filter and the blue color filter.

4. The image sensor of claim 1, wherein the at least one unit color filter of the plurality of unit color filters comprises a first unit color filter in an area where a value of the CRA is a first value and a second unit color filter in an area where a value of the CRA is a second value that is different from the first value, and wherein heights of the plurality of nanoposts in the second unit color filter are different from heights of the plurality of nanoposts in the first unit color filter.

5. The image sensor of claim 1, wherein each of the plurality of unit color filters comprises a green color filter, a red color filter, and a blue color filter, wherein the at least one unit color filter of the plurality of unit color filters comprises a first unit color filter in an area where a value of the CRA is a first value and a second unit color filter in an area where a value of the CRA is a second value that is greater than the first value, wherein heights of the plurality of nanoposts in the blue color filter of the second unit color filter are greater than heights of the plurality of nanoposts in the blue color filter of the first unit color filter, wherein heights of the plurality of nanoposts in the red color filter of the second unit color filter are less than heights of the plurality of nanoposts in the red color filter of the first unit color filter, and wherein heights of the plurality of nanoposts in the green color filter of the second unit color filter are less than heights of the plurality of nanoposts in the green color filter of the first unit color filter.

6. The image sensor of claim 1, wherein each of the plurality of unit color filters comprises a green color filter, a red color filter, and a blue color filter, and wherein amounts of change according to a value of the CRA value in the diameter and the height of the plurality of nanoposts in the at least one unit color filter of the plurality of unit color filters are different from each other in the green color filter, the red color filter, and the blue color filter of the at least one unit color filter of the plurality of unit color filters.

7. The image sensor of claim 6, wherein the at least one unit color filter of the plurality of unit color filters comprises a first unit color filter in an area where a value of the CRA is a first value and a second unit color filter in an area where a value of the CRA is a second value that is greater than the first value, and wherein diameters of the plurality of nanoposts in the second unit color filter are less than diameters of the plurality of nanoposts in the first unit color filter, and heights of the plurality of nanoposts in the second unit color filter are different from heights of the plurality of nanoposts in the first unit color filter.

8. The image sensor of claim 1, wherein, in the at least one unit color filter of the plurality of unit color filters, the plurality of nanoposts are provided in an NxN pattern, where N is a natural number greater than or equal to 2.

9. The image sensor of claim 1, wherein, in each unit color the at least one unit color filter of the plurality of unit color filters, the plurality of nanoposts are provided in a square pattern or a hexagonal pattern.

10. The image sensor of claim 1, wherein diameters of the plurality of nanoposts in a green color filter among at least two unit color filters of the plurality of unit color filters, including the at least one unit color filter, are different from each other.

11. An electronic device comprising:

a lens assembly comprising at least one lens, the lens assembly being configured to form an optical image of a subject;

an image sensor configured to convert the optical image formed by the lens assembly into an electrical signal; and a processor configured to process the electrical signal generated by the image sensor, wherein the image sensor comprises:

a sensor substrate comprising a plurality of unit pixels;

a plurality of unit color filters on the sensor substrate, at least one unit color filter of the plurality of unit color filters comprising a plurality of nanoposts;

a color separating lens array on the plurality of unit color filters, the color separating lens array being configured to separate and condense incident light based on a wavelength of the incident light; and a spacer layer between the sensor substrate and the color separating lens array, and wherein at least one of a diameter and a height of the plurality of nanoposts provided in the at least one unit color filter of the plurality of unit color filters in regions are different from each other based on values of a chief ray angle (CRA) corresponding to the regions.

12. The electronic device of claim 11, wherein the at least one unit color filter of the plurality of unit color filters comprises a first unit color filter in an area where a value of the CRA is a first value and a second unit color filter in an area where a value of the CRA is a second value that is greater than the first value, and wherein diameters of the plurality of nanoposts in the second unit color filter are less than diameters of the plurality of nanoposts provided in the first unit color filter.

13. The electronic device of claim 12, wherein the at least one unit color filter of the plurality of unit color filters comprises a green color filter, a red color filter, and a blue color filter, and wherein a reduction of diameters of the plurality of nanoposts in the blue color filter is greater than a reduction of diameters the plurality of nanoposts in the green color filter and the red color filter.

14. The electronic device of claim 11, wherein the at least one unit color filter of the plurality of unit color filters comprises a first unit color filter in an area where a value of the CRA is a first value and a second unit color filter in an area where a value of the CRA is a second value that is different from the first value, and wherein heights of the plurality of nanoposts in the second unit color filter are different from heights of the plurality of nanoposts in the first unit color filter.

15. The electronic device of claim 11, wherein each of the plurality of unit color filters comprises a green color filter, a red color filter, and a blue color filter, wherein the at least one unit color filter of the plurality of unit color filters comprises a first unit color filter in an area where a value of the CRA is a first value and a second unit color filter in an area where a value of the CRA is a second value that is greater than the first value, wherein heights of the plurality of nanoposts in the blue color filter of the second unit color filter are greater than heights of the plurality of nanoposts in the blue color filter of the first unit color filter, wherein heights of the plurality of nanoposts in the red color filter of the second unit color filter are less than heights of the plurality of nanoposts in the red color filter of the first unit color filter, and wherein heights of the plurality of nanoposts in the green color filter of the second unit color filter are less than heights of the plurality of nanoposts in the green color filter of the first unit color filter.

16. The electronic device of claim 11, wherein each of the plurality of unit color filters comprises a green color filter, a red color filter, and a blue color filter, and wherein amounts of change according to a value of the CRA in the diameter and the height of the plurality of nanoposts in the at least one unit color filter of the plurality of unit color filters are different from each other in the green color filter, the red color filter, and the blue color filter.

17. The electronic device of claim 16, wherein the at least one unit color filter of the plurality of unit color filters comprises a first unit color filter in an area where a value of the CRA is a first value and a second unit color filter in an area where a value of the CRA is a second value that is greater than the first value, and wherein diameters of the plurality of nanoposts in the second unit color filter are less than diameters of the plurality of nanoposts in the first unit color filter, and heights of the plurality of nanoposts in the second unit color filter are different from heights of the plurality of nanoposts in the first unit color filter.

18. An image sensor comprising:

a sensor substrate comprising a plurality of unit pixels;

a plurality of unit color filters on the sensor substrate, at least one unit color filter of the plurality of unit color filters comprising a plurality of nanoposts;

a color separating lens array on the plurality of unit color filters, the color separating lens array being configured to separate and condense incident light based on a wavelength of the incident light; and a spacer layer between the sensor substrate and the color separating lens array, wherein at least one of diameters and heights of the plurality of nanoposts the at least one unit color filter of the plurality of unit color filters in a region are different from each other based on a value of a chief ray angle (CRA) corresponding to the region, and wherein at least one of the diameters and the heights of the plurality of nanoposts in the at least one unit color filter of the plurality of unit color filters are different from each other.

19. The image sensor of claim 18, wherein the at least one unit color filter of the plurality of unit color filters comprises a first unit color filter in an area where a value of the CRA is a first value and a second unit color filter in an area where a value of the CRA is a second value that is greater than the first value, and wherein diameters of the plurality of nanoposts in the second unit color filter are less than diameters of the plurality of nanoposts in the first unit color filter.

20. The image sensor of claim 19, wherein the at least one unit color filter of the plurality of unit color filters comprises a green color filter, a red color filter, and a blue color filter, and wherein a reduction of diameters of the plurality of nanoposts in the red color filter is greater than a reduction of diameters of the plurality of nanoposts in the green color filter and the blue color filter.

* * * * *